US010670975B2

(12) United States Patent
Socha et al.

(10) Patent No.: US 10,670,975 B2
(45) Date of Patent: Jun. 2, 2020

(54) ADJUSTMENT OF A METROLOGY APPARATUS OR A MEASUREMENT THEREBY BASED ON A CHARACTERISTIC OF A TARGET MEASURED

(71) Applicant: ASML NETHERLANDS B.V., Veldhoven (NL)

(72) Inventors: Robert John Socha, San Jose, CA (US); Arie Jeffrey Den Boef, Waalre (NL); Nitesh Pandey, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/061,209

(22) PCT Filed: Nov. 29, 2016

(86) PCT No.: PCT/EP2016/079105

§ 371 (c)(1),
(2) Date: Jun. 11, 2018

(87) PCT Pub. No.: WO2017/102304

PCT Pub. Date: Jun. 22, 2017

(65) Prior Publication Data

US 2018/0364591 A1 Dec. 20, 2018

Related U.S. Application Data

(60) Provisional application No. 62/268,974, filed on Dec. 17, 2015.

(51) Int. Cl.
*G06F 17/00* (2019.01)
*G01N 21/55* (2014.01)
(Continued)

(52) U.S. Cl.
CPC ........ *G03F 7/70641* (2013.01); *G01B 11/272* (2013.01); *G01N 21/8806* (2013.01);
(Continued)

(58) Field of Classification Search
CPC ........ G01B 11/26; G01B 11/272; G01B 5/24; G03F 7/70633; G03F 1/42; G03F 1/84;
(Continued)

(56) References Cited

U.S. PATENT DOCUMENTS

2011/0255066 A1* 10/2011 Fuchs ................ G03F 7/70633 355/67
2012/0013881 A1 1/2012 Den Boef et al.
(Continued)

FOREIGN PATENT DOCUMENTS

CN 101364048 A 2/2009
CN 103201682 7/2013
(Continued)

OTHER PUBLICATIONS

International Search Report and Written Opinion issued for International Patent Application No. PCT/EP2016/079105, dated Mar. 22, 2017.

(Continued)

*Primary Examiner* — Mesfin T Asfaw
(74) *Attorney, Agent, or Firm* — Pillsbury Winthrop Shaw Pittman, LLP

(57) ABSTRACT

A method of adjusting a metrology apparatus, the method including: spatially dividing an intensity distribution of a pupil plane of the metrology apparatus into a plurality of pixels; and reducing an effect of a structural asymmetry in a target on a measurement by the metrology apparatus on the target, by adjusting intensities of the plurality of pixels.

20 Claims, 18 Drawing Sheets

(51) Int. Cl.

*G03F 7/20* (2006.01)
*G01N 21/956* (2006.01)
*G01B 11/27* (2006.01)
*G01N 21/88* (2006.01)

(52) U.S. Cl.

CPC ........... *G01N 21/956* (2013.01); *G03F 7/706* (2013.01); *G03F 7/70633* (2013.01); *G01B 2210/56* (2013.01); *G01N 2021/8848* (2013.01)

(58) Field of Classification Search

CPC ...... G03F 7/70683; G03F 7/20; G03F 9/7015; G03F 7/705; G03F 7/70508; G03F 7/70516; G03F 7/70625; G03F 7/7085; H01L 2223/54426; G06F 17/5081; G06F 17/00; G01N 21/55; G01N 2021/213; G01N 21/47; G01N 21/9501; G01N 2201/06113; G01N 23/201; G01N 23/2055

See application file for complete search history.

(56) References Cited

U.S. PATENT DOCUMENTS

2012/0123581 A1 5/2012 Smilde et al.
2012/0206729 A1 8/2012 Seligson et al.
2012/0327503 A1 12/2012 Manassen et al.
2013/0141730 A1 6/2013 Quintanilha
2013/0245985 A1 * 9/2013 Flock .................. G03F 7/70625 702/105
2015/0346605 A1 12/2015 Den Boef et al.
2016/0025992 A1 1/2016 Van Der Zouw et al.
2016/0313658 A1 10/2016 Marciano et al.

FOREIGN PATENT DOCUMENTS

JP 2013535819 9/2013
TW 200532774 10/2005
WO 2009/133849 11/2009
WO 2012/062858 A1 5/2012

OTHER PUBLICATIONS

Wang, et al., “Improving the measurement performance of angle-resolved scatterometry by use of pupil optimization,” SPIE—International Society for Optical Engineering Proceedings, vol. 8324, Mar. 9, 2012, 8 pgs.

Taiwanese Office Action issued in corresponding Taiwanese Patent Application No. 107118596, dated Dec. 18, 2018.

Office Action dated Jan. 21, 2020 Issued in corresponding Korean Patent Application No. 10-2018-7020146 with Engiish translation.

Office Action dated Feb. 24, 2020 issued in corresponding Chinese Patent Application No. 201680081810.1 with English translation.

* cited by examiner

Table I

| | Overlay Sensitivity | | | | | |
|---|---|---|---|---|---|---|
| | Etch Depth | Floor Tilt | aSWA | DE | K | K/DE |
| Units | nm/nm | nm/nm | nm/deg. | | 1/nm | 1/nm |
| TE polarization | 0.000 | 0.000 | -1.151 | 5228.5 | 53.968 | 0.01032 |
| TM polarization | 0.000 | -1.404 | -2.298 | 3919.5 | 3.665 | 0.00094 |
| Both polarization (BP) | 0.000 | -0.092 | -1.226 | 4539.9 | 28.291 | 0.00623 |

Figure 7

ADJUSTMENT OF A METROLOGY APPARATUS OR A MEASUREMENT THEREBY BASED ON A CHARACTERISTIC OF A TARGET MEASURED

CROSS-REFERENCE TO RELATED APPLICATIONS

This application is the U.S. national phase entry of PCT patent application no. PCT/EP2016/079105, which was filed on Nov. 29, 2016, which claims the benefit of priority of U.S. Provisional Application No. 62/268,974, which was filed on Dec. 17, 2015, and which is incorporated herein in its entirety by reference.

FIELD OF THE DISCLOSURE

The present disclosure relates to adjustment of metrology in electronic device processing based on a characteristic of the target measured.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

In lithographic processes, it is desirable frequently to make measurements of the structures created, e.g., for process control and verification. Various tools for making such measurements are known, including scanning electron microscopes (SEMs), which are often used to measure critical dimension (CD), and specialized tools to measure overlay (the accuracy of alignment of two layers in a device) of the lithographic apparatus. Recently, various forms of scatterometers have been developed for use in the lithographic field. These devices direct a beam of radiation onto a target and measure one or more properties of the scattered radiation—e.g., intensity at a single angle of reflection as a function of wavelength; intensity at one or more wavelengths as a function of reflected angle; or polarization as a function of reflected angle—to obtain a "spectrum" from which a property of interest of the target can be determined. Determination of the property of interest may be performed by various techniques: e.g., reconstruction of the target structure by iterative approaches such as rigorous coupled wave analysis (RWCA) or finite element methods; library searches; and principal component analysis.

The targets used by conventional scatterometers are relatively large (e.g., 40 μm by 40 μm) gratings and the measurement beam generates a spot that is smaller than the grating (i.e., the grating is underfilled). This simplifies mathematical reconstruction of the target as it can be regarded as infinite. However, in order to reduce the size of the targets, e.g., to 10 μm by 10 μm or less, so they can be positioned in amongst product features rather than in the scribe lines, metrology has been proposed in which the grating is made smaller than the measurement spot (i.e., the grating is overfilled). Typically such targets are measured using dark-field scatterometry in which the zeroth order of diffraction (corresponding to a specular reflection) is blocked, and only higher orders processed.

Diffraction-based overlay (DBO) using dark-field detection of the first order diffraction orders enables overlay measurements on smaller targets. These targets can be smaller than the illumination spot and may be surrounded by product structures on a wafer. Multiple targets can be measured in one image. In the known metrology technique, overlay measurement results are obtained by measuring the target twice under certain conditions, while either rotating the target or changing the illumination mode or imaging mode to obtain separately the $-1^{st}$ and the $+1^{st}$ diffraction order intensities. Comparing these intensities for a given grating provides a measurement of asymmetry in the grating.

One approach to improve metrology accuracy is better control at the design stage of overlay metrology targets compatible to known illumination mode and other process constraints so that structural asymmetry in the target is minimized by design. This disclosure addresses an alternative approach where even if structural asymmetry exists in the target, illumination is controlled to negate the effect of asymmetry in overlay measurement. In other words, the measurement accuracy is improved by utilizing the flexibility in reconfiguring the illumination according to embodiments of the present disclosure rather than changing the target design.

SUMMARY

Disclosed herein is a method of adjusting a metrology apparatus, the method comprising: spatially dividing an intensity distribution in a pupil plane of the metrology apparatus into a plurality of pixels; reducing an effect of a structural asymmetry in a target on a measurement by the metrology apparatus on the target, by adjusting, using a computer, intensities of the plurality of pixels.

Disclosed herein is a method of adjusting a metrology apparatus, the method comprising: adjusting a parameter of the metrology apparatus or of a measurement by the metrology apparatus on a target, based on a characteristic of the target.

Disclosed herein is a method comprising: setting a parameter of a metrology apparatus or of a measurement by the metrology apparatus on a target to a value adjusted based on a characteristic of the target; measuring the target with the metrology apparatus.

Disclosed herein is a method comprising: setting a characteristic of a target to a value based on which a parameter of a metrology apparatus or of a measurement by the metrology apparatus on the target is adjusted; fabricating the target on a substrate.

Disclosed herein is a computer program product comprising a non-transitory computer-readable medium having instructions thereon, the instructions when executed by a computer implementing any of the above methods.

BRIEF DESCRIPTION OF THE DRAWINGS

These and other aspects and features of the present disclosure will become apparent to those ordinarily skilled in the art upon review of the following description of specific embodiments of the disclosure in conjunction with the accompanying figures, wherein:

FIG. 7 shows a table (Table I) listing results of the overlay sensitivity calculation for various illumination polarizations;

DETAILED DESCRIPTION

This specification discloses one or more embodiments that incorporate the features of this disclosure. The disclosed embodiment(s) merely exemplify the inventive concepts. The scope of the disclosure is not limited to the disclosed embodiment(s). The disclosure is defined by the claims appended hereto. The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure, or characteristic in connection with other embodiments whether or not explicitly described.

Embodiments of the disclosure may be implemented in hardware, firmware, software, or any combination thereof. Embodiments of the disclosure may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present disclosure may be implemented.

Figure 1:
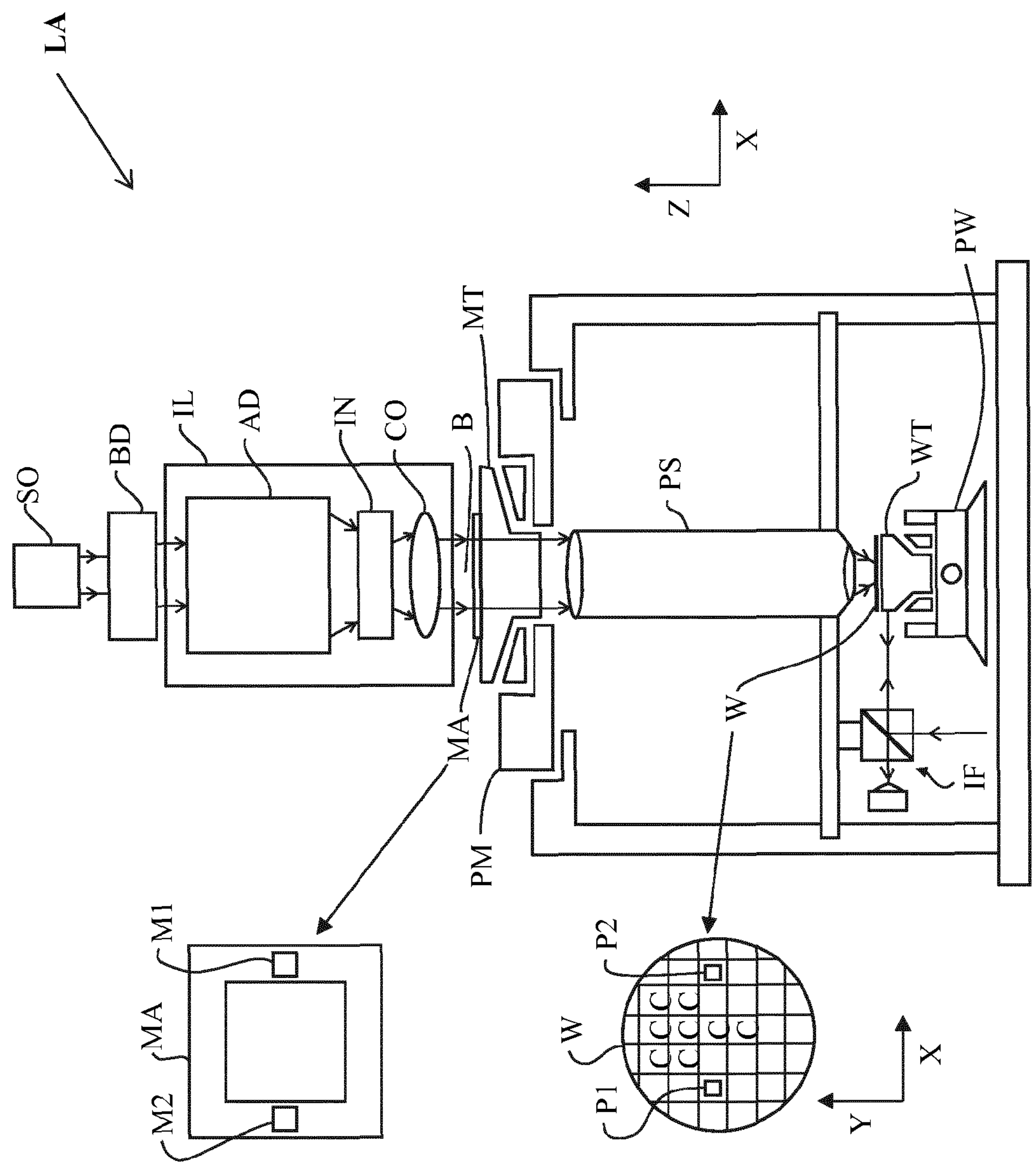
FIG. 1 depicts a lithographic apparatus according to an embodiment of the present disclosure.

FIG. 1 schematically depicts a lithographic apparatus LA. The apparatus includes an illumination system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; a substrate table (e.g., a wafer table) WT constructed to hold a substrate (e.g., a resist coated wafer) W and connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types.

An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. The intensity distribution in the pupil plane is referred to as the "illumination pupil" elsewhere in the specification. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table MT), and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

In general, movement of the patterning device support (e.g., mask table) MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the patterning device support (e.g., mask table) MT may be connected to a short-stroke actuator only, or may be fixed.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment markers may also be included within dies, in amongst the device features, in which case it is desirable that the markers be as small as possible and not require any different imaging or process conditions than adjacent features. The alignment system, which detects the alignment markers is described further below.

The depicted apparatus could be used in at least one of the following modes:

1. In step mode, the patterning device support (e.g., mask table) MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the patterning device support (e.g., mask table) MT and the substrate table WT are scanned synchronously while a pattern imparted to the radiation beam is projected onto a target portion C (i.e., a single dynamic exposure). The velocity and direction of the substrate table WT relative to the patterning device support (e.g., mask table) MT may be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g., mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2A:
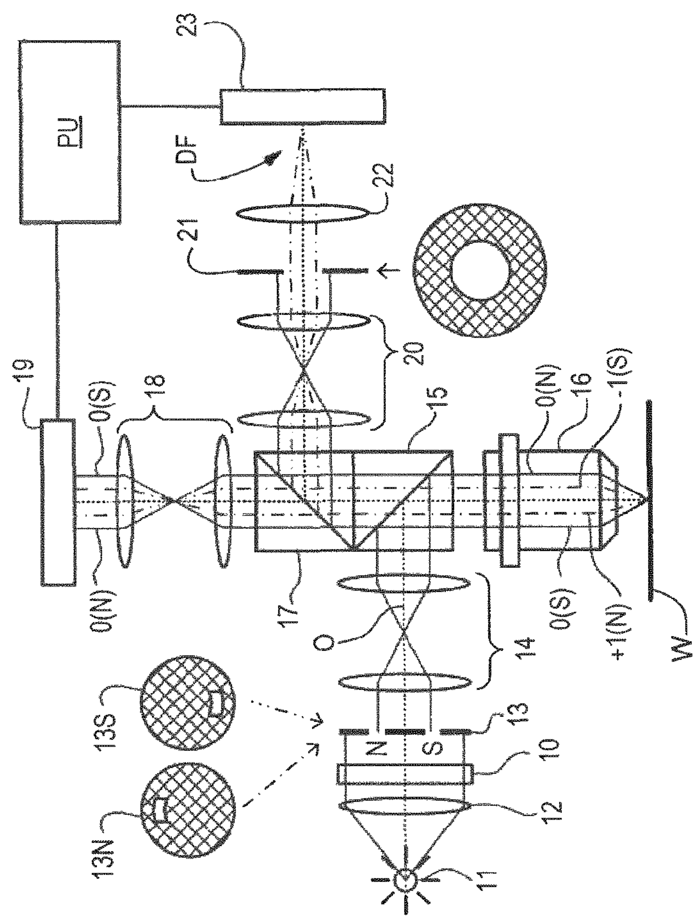
FIG. 2A shows a schematic diagram of a dark-field scatterometer for use in measuring targets according to embodiments of the disclosure using a first pair of illumination apertures.

A dark field metrology apparatus suitable for use in embodiments of the disclosure is shown in FIG. 2A, although the disclosure is not limited to dark-field scatterometry only. In the example shown in FIG. 2A, a target grating T is illuminated and rays diffracted from the grating are collected for measurement. This is illustrated in more detail in FIG. 2B. The dark field metrology apparatus may be a stand-alone device or incorporated in either the lithographic apparatus LA shown in FIG. 1, e.g., at the measurement station, or a lithographic cell. An optical axis, which has several branches throughout the apparatus, is represented by a dotted line 0. In this apparatus, light emitted by source 11 (e.g., a xenon lamp) is directed onto substrate W via a beam splitter 15 by an optical system comprising lenses 12, 14 and objective lens 16. These lenses are arranged in a double sequence of a 4F arrangement. A different lens arrangement can be used, provided that it still provides a substrate image onto a detector, and simultaneously allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The illumination system in the present examples forms an off-axis illumination mode. In the first illumination mode, aperture plate 13N provides off-axis from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark as any unnecessary light outside the desired illumination mode will interfere with the desired measurement signals.

Figure 2B:
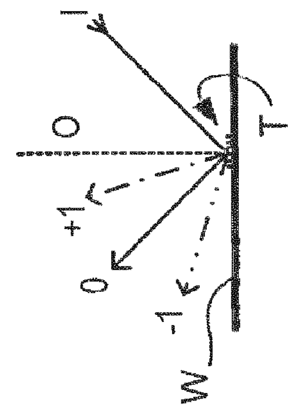
FIG. 2B shows a detail of diffraction spectrum of a target grating for a given direction of illumination.

As shown in FIG. 2B, target grating T is placed with substrate W normal to the optical axis O of objective lens 16. A ray of illumination I impinging on grating T from an angle off the axis O gives rise to a zeroth order component of illumination (solid line 0) and two first order components of illumination (dot-chain line +1 and double dot-chain line −1). It should be remembered that with an overfilled small target grating, these rays of illumination are just one of many parallel rays covering the area of the substrate including metrology target grating T and other features. Since the aperture in plate 13 has a finite width (necessary to admit a useful quantity of light, the incident rays I will in fact occupy a range of angles, and the diffracted rays of 0 and +1/−1 order will be spread out somewhat. According to the point spread function of a small target, each order +1 and −1 will be further spread over a range of angles, not a single ideal ray as shown. Note that the grating pitches and illumination angles can be designed or adjusted so that the first order rays entering the objective lens are closely aligned with the central optical axis. The rays illustrated in FIGS. 2A and 2B are shown somewhat off axis, purely to enable them to be more easily distinguished in the diagram.

At least the 0 and +1 or −1 orders diffracted by the target on substrate W are collected by objective lens 16 and directed back through beam splitter 15. Returning to FIG. 2A, both the first and second illumination modes are illustrated, by designating diametrically opposite apertures labeled as north (N) and south (S). In other embodiments, East (E) and West (W) labels may be used depending on the position of the apertures. When the incident ray I is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled −1(S)) are the ones which enter the lens 16.

A second beam splitter 17 divides the diffracted beams into two measurement branches. In a first measurement branch, optical system 18 forms a diffraction spectrum (pupil plane image) of the target on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for focusing the metrology apparatus and/or normalizing intensity measurements of the first order beam.

In the second measurement branch, optical system 20, 22 forms an image of the target on the substrate W on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image of the target formed on sensor 23 is formed only from the −1 or +1 first order beam. The images captured by sensors 19 and 23 are output to image processor and controller PU, the function of which will depend on the particular type of measurements being performed. Note that the term 'image' is used here in a broad sense. An image of the grating lines as such will not be formed, if only one of the −1 and +1 orders is present.

The particular forms of aperture plate 13 and field stop 21 shown in FIG. 2A are purely examples. In another embodiment of the disclosure, on-axis illumination of the targets is used and an aperture stop with an off-axis aperture is used to pass substantially only one first order of diffracted light to the sensor. In yet other embodiments, $2^{nd}$, $3^{rd}$ and higher order beams (not shown in FIG. 2B) can be used in measurements, instead of or in addition to the first order beams.

In order to make the illumination adaptable to these different types of measurement, the aperture plate 13 may comprise a number of aperture patterns formed around a disc, which rotates to bring a desired pattern into place. Alternatively or in addition, a set of plates 13 could be provided and swapped, to achieve the same effect. A programmable illumination device such as a deformable mirror array or transmissive spatial sight modulator (SLM) can be used also. Moving mirrors or prisms can be used as another way to adjust the illumination mode.

As explained in relation to aperture plate 13, the selection of diffraction orders for imaging can alternatively be achieved by altering the pupil-stop 21, or by substituting a pupil-stop having a different pattern, or by replacing the fixed field stop with a programmable SLM. In that case the illumination side of the measurement optical system can remain constant, while it is the imaging side that has first and second modes. In the present disclosure, therefore, there are effectively three types of measurement method, each with its own advantages and disadvantages. In one method, the illumination mode is changed to measure the different orders. In another method, the imaging mode is changed. In a third method, the illumination and imaging modes remain unchanged, but the target is rotated through 180 degrees. In each case the desired effect is the same, namely to select first and second portions of the non-zero order diffracted radiation which are symmetrically opposite one another in the diffraction spectrum of the target. In principle, the desired selection of orders could be obtained by a combination of changing the illumination modes and the imaging modes simultaneously, but that is likely to bring disadvantages for no advantage, so it will not be discussed further.

While the optical system used for imaging in the present examples has a wide entrance pupil which is restricted by the field stop 21, in other embodiments or applications the entrance pupil size of the imaging system itself may be small enough to restrict to the desired order, and thus serve also as the field stop.

Typically, a target grating will be aligned with its grating lines running either north-south or east-west. That is to say, a grating will be aligned in the X direction or the Y direction of the substrate W. Note that aperture plate 13N or 13S can only be used to measure gratings oriented in one direction (X or Y depending on the set-up). For measurement of an orthogonal grating, rotation of the target through 90° and 270° might be implemented. As mentioned already, the off-axis apertures could be provided in field stop 21 instead of in illumination aperture plate 13. In that case, the illumination would be on axis.

Additional aperture plates can be used to combine the illumination modes described above. Provided that cross-talk between these different diffraction signals is not too great, measurements of both X and Y gratings can be performed without changing the illumination mode.

As mentioned before, metrology targets often take the form of one or more gratings. The gratings can be placed in the scribelines or in the product area. If the gratings are located in product areas, product features may also be visible in the periphery of an image field. Image processor and controller PU processes these images using pattern recognition to identify the separate images if a plurality of gratings is used.

While the target structures described above are metrology targets specifically designed and formed for the purposes of measurement, in other embodiments, properties may be measured on targets which are functional parts of devices formed on the substrate. Many devices have regular, grating-like structures. The terms 'target grating' and 'target structure' as used herein do not require that the structure has been provided specifically for the measurement being performed.

In association with the physical grating structures of the targets as realized on substrates and patterning devices, an embodiment may include a computer program containing one or more sequences of machine-readable instructions describing a methods of producing targets on a substrate, measuring targets on a substrate and/or analyzing measurements to obtain information about a lithographic process. This computer program may be executed for example within unit PU in the apparatus of FIG. 2 and/or a control unit in the lithography apparatus. There may also be provided a data storage medium (e.g., semiconductor memory, magnetic or optical disk) having such a computer program stored therein. Where an existing metrology apparatus, for example of the type shown in FIG. 2A, is already in production and/or in use, the disclosure can be implemented by the provision of updated computer program products for causing a processor to perform the methods described herein and so calculate exposure dose. The program may optionally be arranged to control the optical system, substrate support and the like to perform the steps for measurement of a suitable plurality of target structures.

Figure 3A:
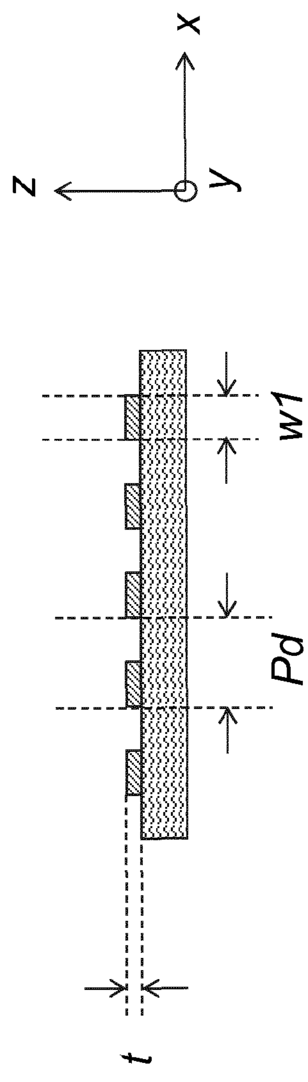
FIG. 3A depicts a cross sectional view of a grating.

FIG. 3A illustrates the cross sectional view a standard single-layer grating pattern. In FIG. 3A, a limited section of only five periods of the grating is shown. The grating period is Pd, horizontal line width of individual grating lines is w1, and vertical thickness of each grating line is t. In the full grating, the pattern may repeat in the vertical (z axis) and horizontal (x axis) or lateral (y axis) directions. The grating pattern in FIG. 3A may comprise, for example, a chrome pattern on a reticle. The parameters Pd, wl, and t may be used to describe aspects of the grating, along with other parameters.

Figure 3B:
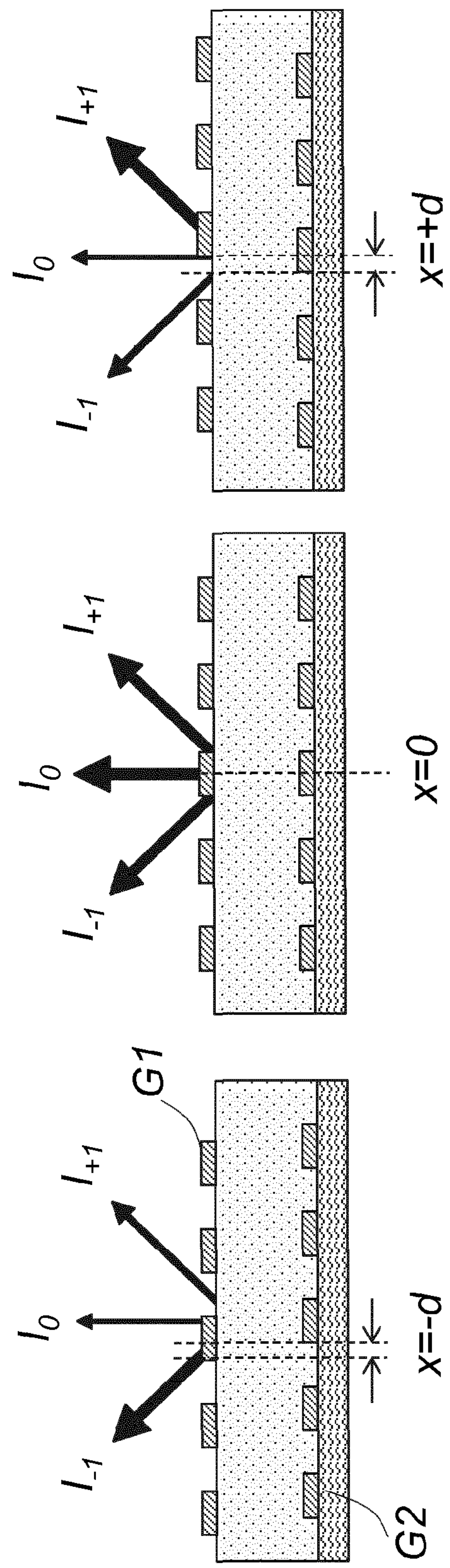
FIGS. 3B-D depict the principle of overlay measurement between two vertical layers of gratings using diffraction-based scatterometry.
Figure 3C:
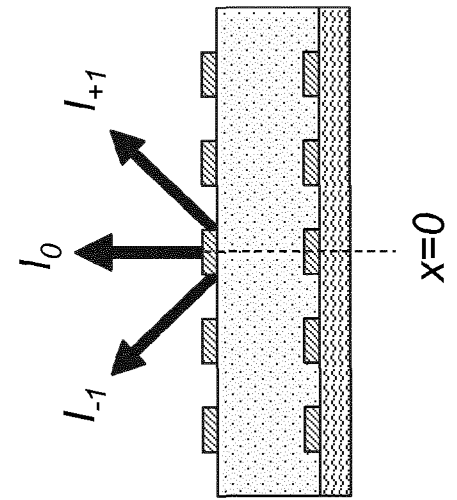
Figure 3D:
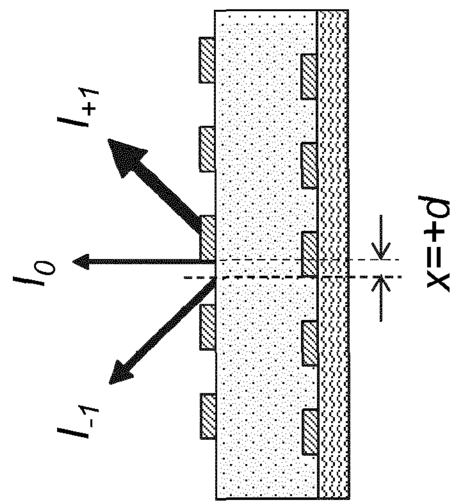

While grating sections may be on a same device layer and used for same-layer alignment and/or image stitching purposes, FIGS. 3B-D show how grating-based metrology structures can be used to measure overlay and/or alignment between two different layers in an electronic device. A first grating G1 is on layer one, and a second grating G2 is on layer two, where the two layers mimic device layers in an actual device to be manufactured (also referred to as "product"). The device may have a first pattern in layer one and a second pattern in layer two, and the overlay and/or alignment between those two patterns are of interest. FIG. 3B shows overlay with a bias in the negative direction (along the horizontal x axis), and FIG. 3D shows overlay with a bias in the positive direction (along the x axis). The x axis is also referred to as the direction of overlay. FIG. 3C shows the case where there is no overlay between G1 and G2, as they are aligned (along the vertical z direction) perfectly. Persons skilled in the art would appreciate that a designer may intentionally add positive or negative bias along the x direction for measurement and image matching purposes, and measure the effect of bias by measuring the variation of intensity (I) of the diffracted beams. Here, only the zero-order, +1 order and −1 order diffracted beams are shown for simplicity, and higher order beams are not shown.

In a diffraction-based metrology apparatus, such as YieldStar by ASML, illumination intensity distribution can be adjusted by adding a Spatial Light Modulator (SLM) in the illumination. SLMs imposes some form of spatially varying intensity and/or modulation on a beam of radiation. SLMs may comprise physical mechanisms such as programmable mirror arrays, programmable LCD panels etc., or a computer representation thereof. Addition of an SLM enables a free-form illumination. The intensity distribution in the pupil plane of the illumination is represented in the simulation domain by a spatial array of pixels, where each pixel or a group of pixels can be independently adjusted to achieve various configurations of the illumination depending on desired lithographic imaging performance. Addition of the SLM helps in reduction of stray light in the system, and possibly reduces the effect of mark asymmetry on the overlay measurement. The term “mark” is used here to include a pattern in a design layout which is used as a metrology target. The mark may be part of the circuit, or a special metrology mark placed in a scribe line of the wafer. This disclosure assumes the mark is not altered, but the illumination configuration is altered to negate the effect of process-induced structural asymmetry in the mark. By proper selection of pixels in the illumination pupil, it is possible to reduce the effect of mark asymmetry without impacting the contrast (i.e. detectability) of the mark.

Particularly, this disclosure focuses on the feasibility of adjusting a parameter of a metrology apparatus (e.g., controlling illumination) to improve the quality of the measurement (e.g., overlay detectability and measurement accuracy). It is possible to optimize both the illumination (i.e. the “source”) and the overlay metrology target (i.e. the “mark”) to improve measurement accuracy (“Source-Mark Optimization”). Here the term “source” broadly includes both the radiation source and illumination adjustment optics included in a radiation system. The present disclosure provides an illumination optimization algorithm, including free-form illumination optimization, for a given overlay metrology target. Specifically, the disclosure describes selection of illumination points to, among other things, eliminate stray lights, generate sufficient strength of optical signal for detection and analysis, provide improved contrast of the mark, and, decrease sensitivity to process variation. The source is not the only parameter that can be adjusted based on a characteristic of the target. Any other parameter of the metrology apparatus or the measurement may be adjusted.

There are areas of the illumination pupil that do not produce ±1 order information. Those areas only add zeroth order. Although the zeroth order is filtered, the area of the pupil does produce stray light by reflections in the optics “bleeding” into the ±1 order area. Using simple geometry, these 0 order areas of the illumination are eliminated. The location of this 0 order area is pitch and wavelength dependent. Hence a spatial light modulator (SLM) or a similar device is needed to change the illumination.

Imaging conditions in the lithographic apparatus may be made similar to that of an existing diffraction-based metrology apparatus, such as YieldStar, manufactured by ASML. In a non-limiting example configuration, the illumination may have a numerical aperture (NA) of 0.95. FIG. 4A shows an illumination pupil with a standard quadrant aperture in a lithographic apparatus. In a metrology apparatus, usually there is no quadrant aperture. A pupil of the objective is imaged via four wedges to re-direct zeroth order signal away from the sensor. In contrast, lithographic apparatuses use pupil filters of various shapes. One of the advantages of the present disclosure is that when illumination optimization is performed in the simulation domain, any shape of aperture and pupil filter can be assumed to mimic the actual configuration of the illumination pupil of the lithographic apparatus.

Figure 4B:
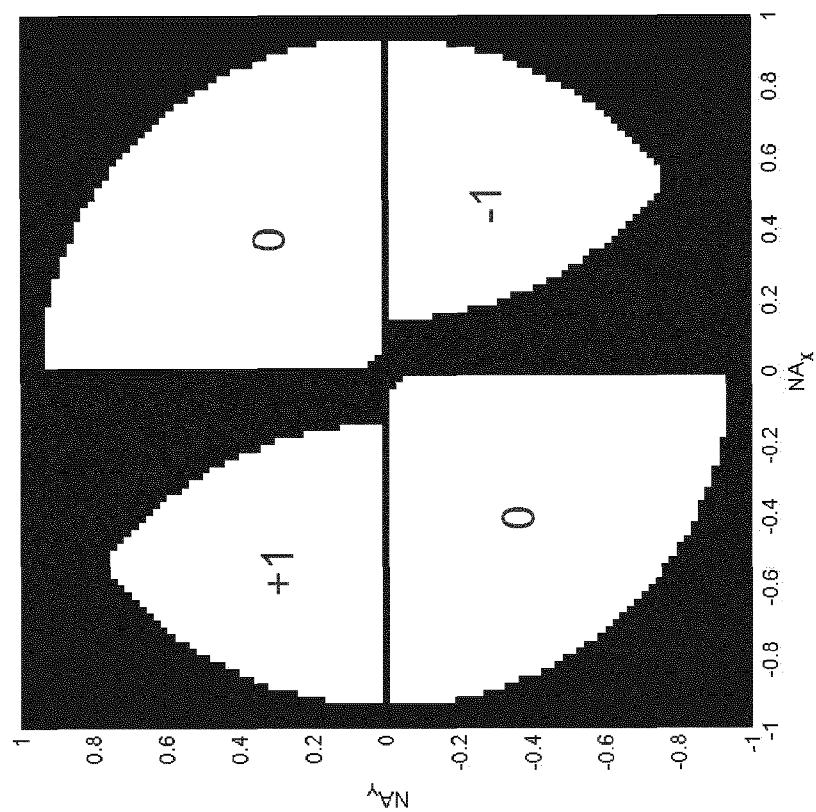
FIGS. 4A-4F each show various stages of illumination shaping by apertures and pupil filters, according to an embodiment of the present disclosure.
Figure 4A:
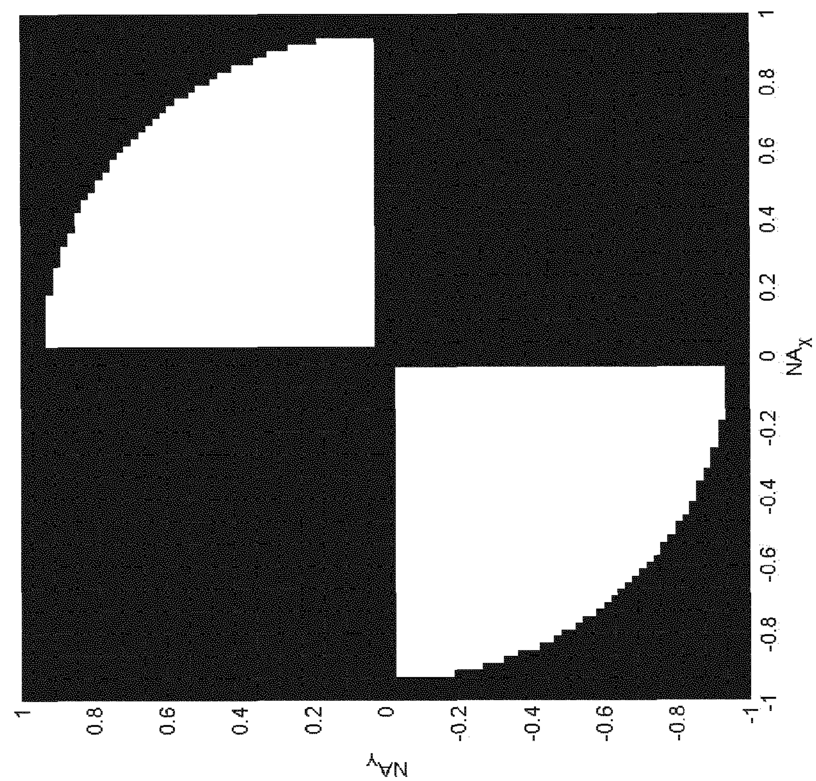
Figure 4D:
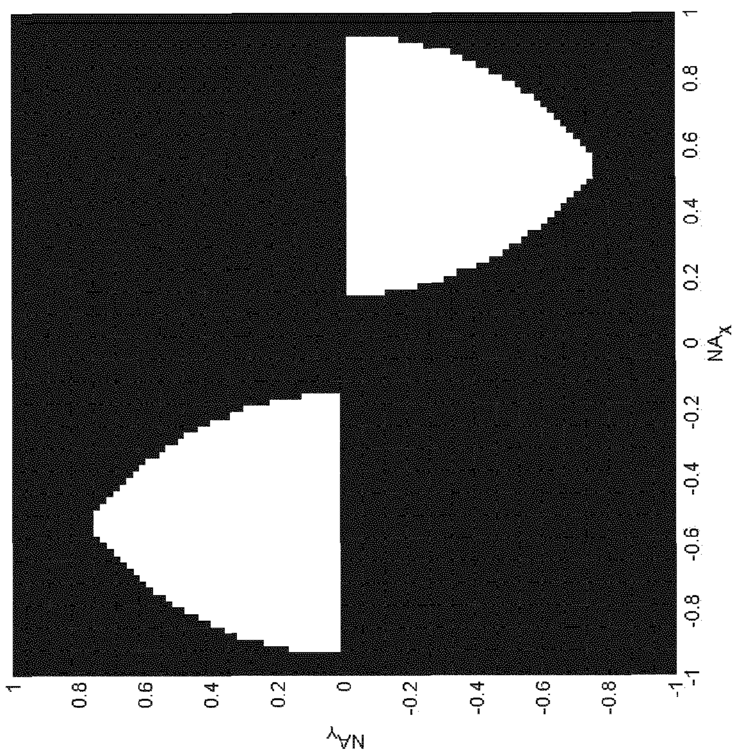
Figure 4C:
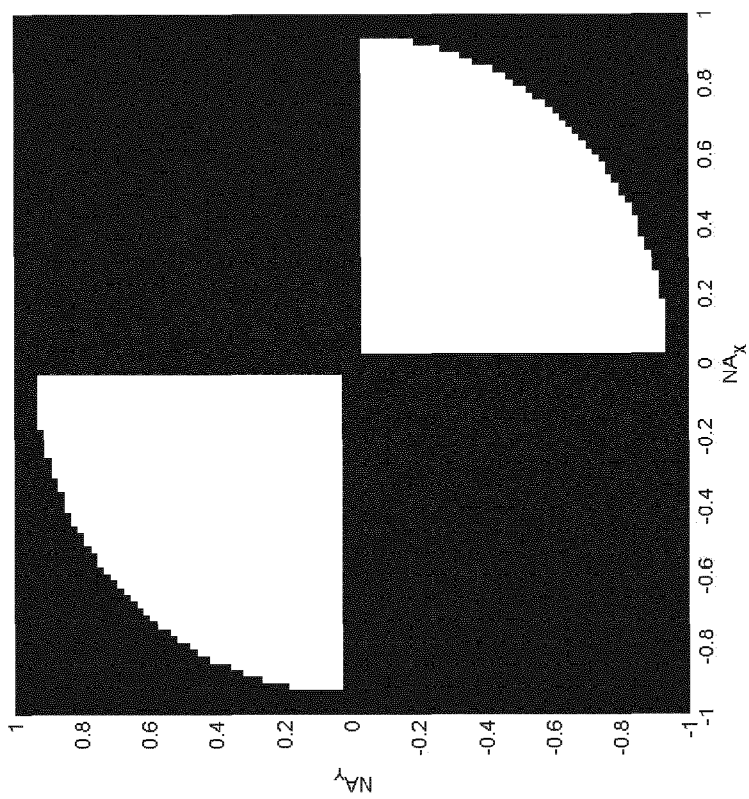
Figure 4F:
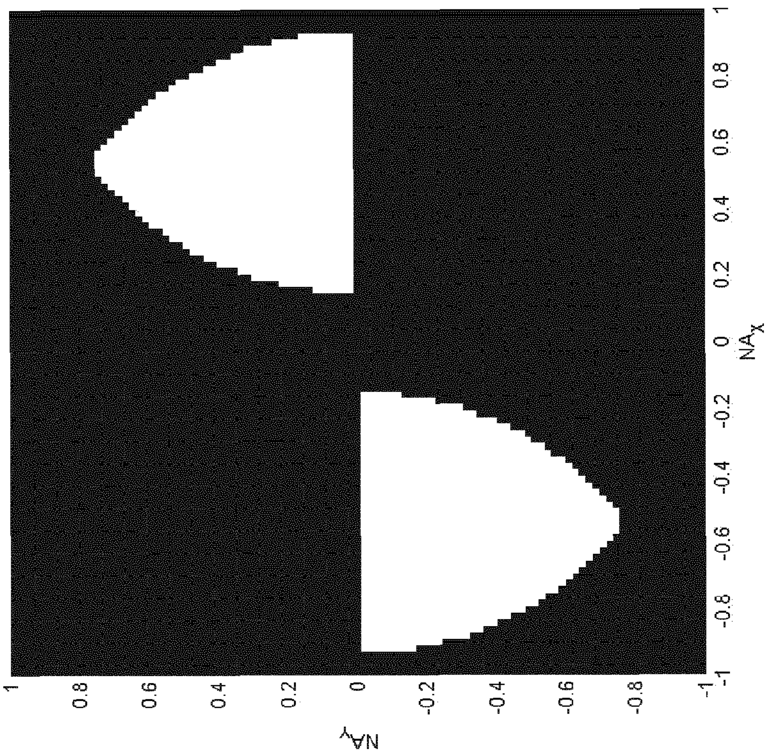
Figure 4E:
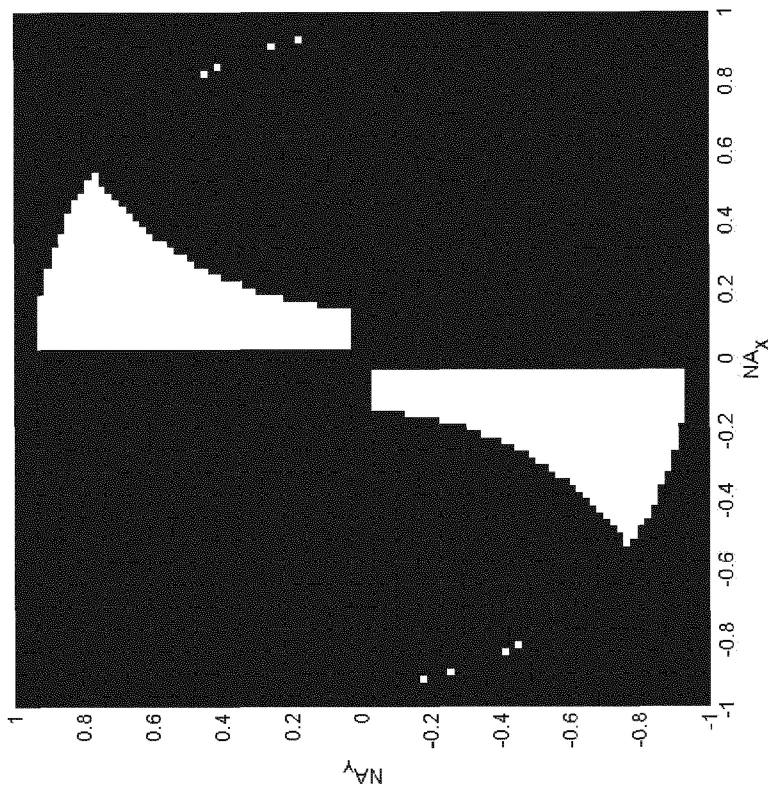

FIG. 4B shows an example illumination shape at the entrance pupil of the objective lens in a metrology apparatus. Zeroth order illumination passes through the upper right and lower left quadrants of the pupil as shown in FIG. 4B. By using a pupil filter such as the one shown in FIG. 4C, it is possible to block most of the zeroth order illumination, while letting the +1 and −1 order of the illumination pass through to the objective lens. FIG. 4D shows the shape of the illumination at the exit pupil of the objective lens. FIG. 4E shows the unutilized areas of the illumination. FIG. 4F shows a better choice of a illumination pupil shape (compared to the standard quadrant aperture shown in FIG. 4A) where exit pupil of the objective would be optimized to produce better results to counter the negative effect of structural asymmetry in the target, which is a major goal of this disclosure.

To achieve decreased sensitivity to lithography process variation, simulations are performed with various target designs mimicking actual devices. Example devices include, but are not limited to, Dynamic Random Access Memory (DRAM) buried word line (bWL) layer, DRAM bit line (BL) layer, Logic metal layer (M1), and DRAM storage node (SN) layer.

Figure 5:
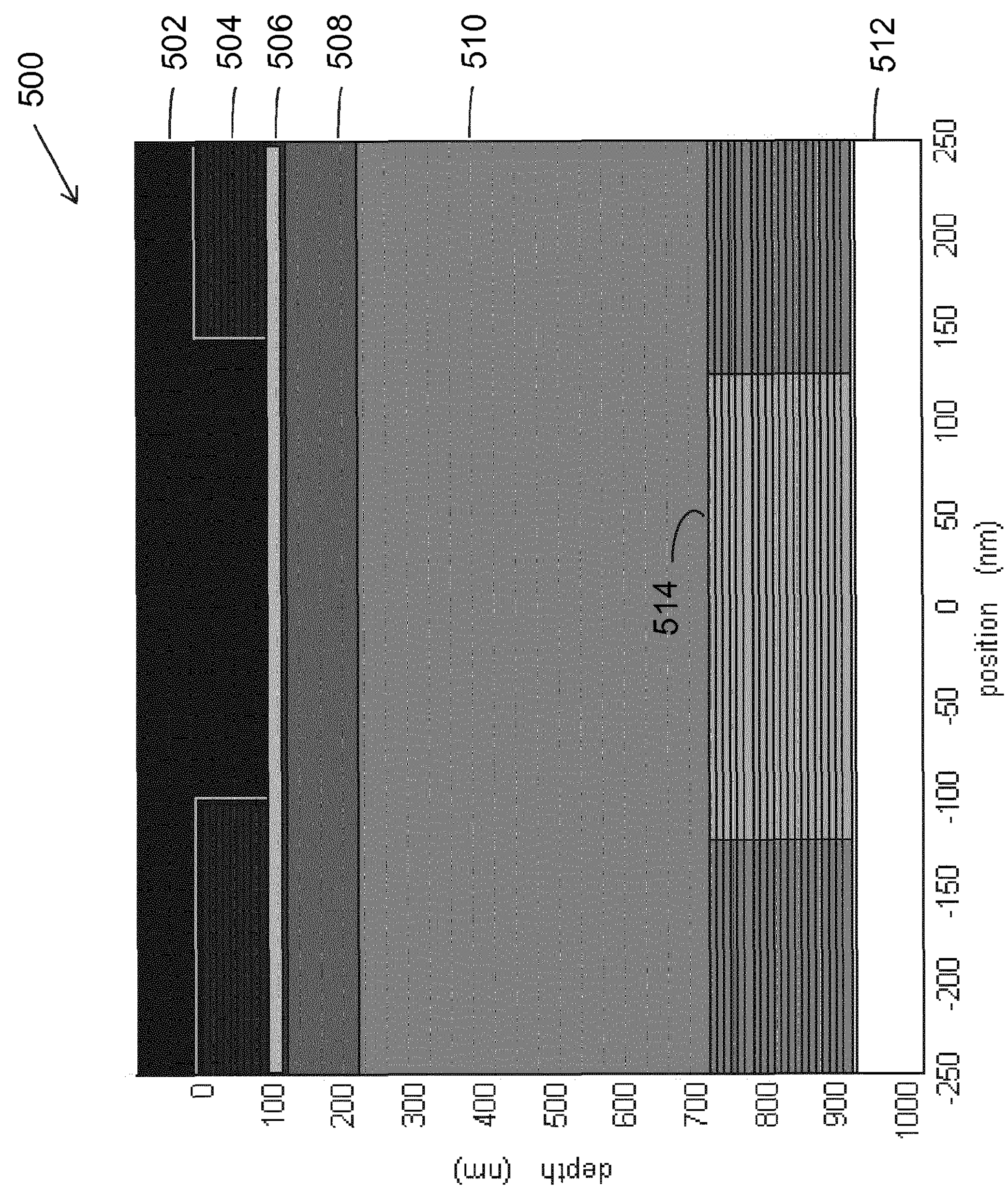
FIG. 5 shows a target with a multilayer memory device structure used to evaluate the efficacy of the illumination optimization according to an embodiment.

In an embodiment, using an exemplary circuit pattern for a DRAM storage node (SN), it was determined which pupil pixels would decrease sensitivity to the asymmetry induced by process variation. The metrology target (“mark”) was made to replicate the DRAM SN layer pattern, as shown in FIG. 5, because such a pattern is known to have overlay sensitivity to process-induced structural asymmetry. In the structure shown in FIG. 5, grating pitch is 500 nm, critical dimension of the top layer is 250 nm. The illumination wavelength is 550 nm. An illumination pupil shape shown in FIG. 4F is used as the starting condition for illumination optimization. In the example device structure 500, the top metal layer 502 is patterned using the resist layer 504. An anti-reflection coating layer 506, a carbon layer 508, an inter-layer dielectric (ILD) separate the top layer from the buried storage node layer 514 made of tungsten. The substrate layer 512 is made of silicon. Persons skilled in the art would appreciate that the scope of the disclosure is not limited by the materials used in the device structure.

In addition to decreasing sensitivity to process variation, the mark needs to have sufficient diffraction efficiency (DE) and stack sensitivity (SS), so sufficient illumination pupil pixels are needed to reconfigure the illumination shape to study the effect of a particular asymmetry. DE is the target design parameter that represents the average intensity and SS is related to DE. DE is expressed as:

$$DE=\tfrac{1}{4}[(I_{p\_pb}+I_{m\_pb})+(I_{p\_nb}+I_{m\_nb})] \quad \text{(Eq. 1)}$$

In this equation, I indicates intensity, p in the suffix indicates +1 order diffraction component, m in the suffix indicates −1 order diffraction component, pb in the suffix indicates positive bias, nb in the suffix indicates negative bias. For example, $I_{p\_pb}$ means the intensity of the +1 order diffraction component with positive bias.

The present approach first examines gradients of intensity to verify that certain illumination configuration can minimize the effect of asymmetry. An asymmetry parameter q is defined. The following equations establish how the parameter q is related to overlay.

The overlay, OV, is defined as, $$OV=\frac{A}{K} \quad \text{(Eq. 2)}$$

where $$A=\frac{1}{2}[(I_{p\_pb}-I_{m\_pb})+(I_{p\_nb}-I_{m\_nb})] \quad \text{(Eq. 3)}$$

Here, A is asymmetry response, and, K is a mathematical constant representing overlay error, where $$K = \frac{1}{2d}[(I_{p\_pb} - I_{m\_pb}) - (I_{p\_nb} - I_{m\_nb})] \quad \text{(Eq. 4)}$$

In this equation, d is the overlay bias. K represents contrast in the target image due to overlay error. Overlay bias d can be in the positive or negative direction, as shown in FIGS. 3B and 3D respectively. Stack Sensitivity (SS) is defined as K/DE, and is a key performance indicator (KPI) for target design. One of the goals of target design is to maximize SS. Overlay error due to asymmetry goes to zero when A goes to zero.

The algorithm used to optimize the illumination pixel by pixel for a known asymmetry in the target is based on figuring out where overlay is most sensitive to an asymmetry parameter q. The gradient of OV with respect to asymmetry parameter q is expressed as:

$$\frac{\partial OV}{\partial q} = \left(\frac{1}{K}\frac{\partial A}{\partial q} - \frac{A}{K^2}\frac{\partial K}{\partial q}\right) \approx \frac{1}{K}\frac{\partial A}{\partial q} \quad \text{(Eq. 5)}$$

At a pixel, intensity can be generically expressed as $I_x$ (with x alternatively being p_pb, m_pb, p_nb and m_nb):

$$I_x = \int d\bar{\sigma} I_s(\bar{\sigma}) P_{align}(\bar{\sigma}) P_{obj}(\bar{\sigma}) \int d\bar{\rho} I_{RCWA}(\bar{\sigma}) \varepsilon(\bar{\sigma} - \bar{\rho}) \quad \text{(Eq. 6)}$$

Here, σ indicates the coordinate of the illumination pupil, and, ρ indicates convolution coordinate of the convolution kernel, ε. The convolution kernel is a function related to the finite spot of the metrology or to the finite size of the metrology mark. $P_{align}$ indicates the pupil of the alignment camera and $P_{obj}$ indicates the pupil filter in the exit pupil of the objective lens. $I_S$ indicates intensity of the illumination (the parameter to be optimized for minimum sensitivity to process asymmetry or for maximum K)._$I_{RCWA}$ indicates the intensity as calculated by rigorous coupled wave analysis (RCWA), which is a semi-analytic method in computational electromagnetics applied to solve diffraction scattering from a metrology target with a periodic structure, such as described here. The gradient of intensity with respect to the asymmetry parameter q is expressed as:

$$\frac{\partial I_x}{\partial q} = \int d\bar{\sigma} I_s(\bar{\sigma}) P_{align}(\bar{\sigma}) P_{obj}(\bar{\sigma}) \int d\bar{\rho} \frac{\partial I_{RCWA}(\bar{\sigma})}{\partial q} K(\bar{\sigma} - \bar{\rho}) \quad \text{(Eq. 7)}$$

The gradient of intensity from RCWA is independent of illumination intensity, $I_s$. So it can be pre-calculated for fast optimization. To optimize illumination to minimize overlay sensitivity to the parameter q, the following second order derivative equation is used to express gradient with respect to illumination:

$$\frac{\partial^2 OV}{\partial I_s \partial q} = \left(-\frac{1}{K^2}\frac{\partial K}{\partial I_s}\frac{\partial A}{\partial q} + \frac{1}{K}\frac{\partial^2 A}{\partial q \partial I_s} - \frac{1}{K^2}\frac{\partial A}{\partial I_s}\frac{\partial K}{\partial q} + 2\frac{A}{K^3}\frac{\partial K}{\partial I_s}\frac{\partial K}{\partial q} - \frac{A}{K^2}\frac{\partial^2 K}{\partial q \partial I_s}\right) \quad \text{(Eq. 8)}$$

Using the full equation above for $$\frac{\partial^2 OV}{\partial I_s \partial q}$$

does not result in more computational time, compared to a case where it is approximated that $$\frac{\partial^2 OV}{\partial I_s \partial q} \approx \frac{1}{K}\frac{\partial^2 A}{\partial I_s \partial q}.$$

Figure 6B:
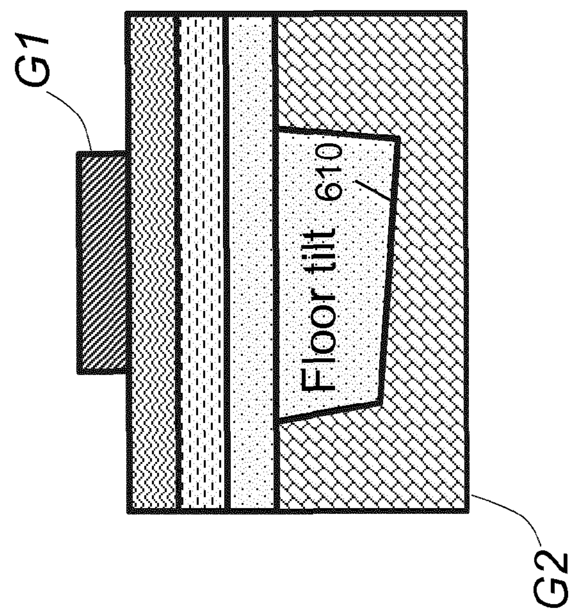
FIG. 6A-B show examples of lithography process-induced asymmetry in target structure.
Figure 6A:
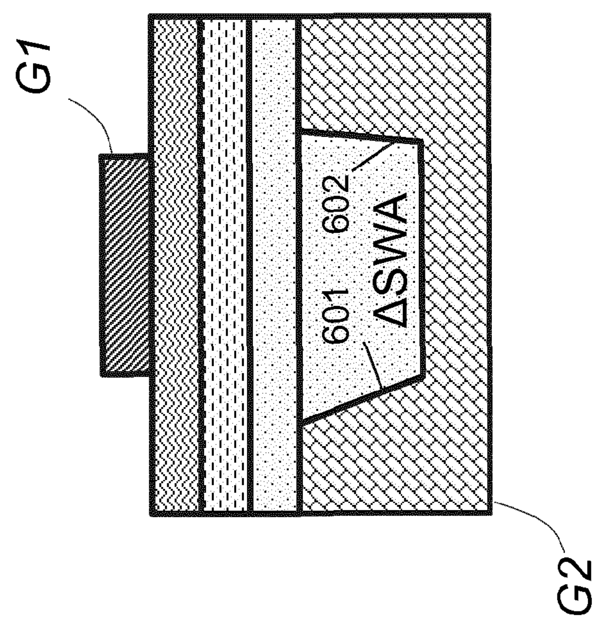

The next step is to define a cost function (CF) for the illumination. The CF is the mathematical function to be optimized to get the optimized illumination. The cost function has the asymmetry parameter q as a variable. The goal of the optimization problem is to minimize the cost function, which is expressed as the following equation:

$$\min CF(I_s) = \sum_{i=1}^{m}\left[\frac{\partial OV(\alpha)}{\partial q_i}\right]^n \quad \text{(Eq. 9)}$$

$$\left|\frac{K(\alpha)}{DE(\alpha)}\right| > \beta$$

is the constraint used in the minimization equation above, where β is a fixed (non-floating) parameter, and a is a floating parameter. In the equation above, the norm (indicated as n in the equation) of the overlay sensitivity $$\frac{\partial OV}{\partial q}$$

is minimized. The number of parameters to optimize the illumination over is m (i.e., i=1, 2, . . . , m). Examples of the asymmetry parameters are asymmetry in side wall angle (aSWA), floor tilt, etch depth etc. FIGS. 6A-B show a target structure with a top grating layer G1 and a bottom grating layer G2, where structural asymmetries are shown in an exaggerated manner for illustrative purposes. FIG. 6A schematically shows that there is a difference between side wall angle for the wall 601 and side wall angle of the wall 602. The side wall angle difference (ΔSWA) gives rise to the aSWA parameter. FIG. 6B schematically shows the floor 610 is tilted in the bottom grating layer. This asymmetry gives rise to the floor tilt parameter. For the DRAM SN layer device shown in FIG. 5, the overlay sensitivity due to process variation is studied for the bottom tungsten layer 514 for three illumination polarizations: transverse electric (TE), transverse magnetic (TM) and a combination of both polarizations (BP). The results are tabulated in Table I in FIG. 7. Persons skilled in the art would appreciate that in addition to polarization, wavelength of the illumination source may also be changed, though not specifically described in the example embodiments here.

In the cost function minimization problem, a is the polarization mixing parameter to take advantage of the sensitivity due to TE and TM polarization, according to the following equation:

$$I_{RCWA} = \alpha I_{TE_{RCWA}} + (1-\alpha) I_{TM_{RCWA}} \quad \text{(Eq. 10)}$$

In the above equation, α=0.5 for BP, α=1 for TE polarization, and α=0 for TM polarization. α can also be optimized to minimize sensitivity to process asymmetry. The optimization constraint is recast as a barrier function expressed generically as $x^{-b}$. The barrier function is related to stack sensitivity (SS) of a particular device structure. A barrier function is used in optimization to represent a less than (or greater than) Heaviside function constraint. The barrier function has a continuous gradient while a Heaviside function does not. For example, in a standard Source-Mask Optimization (SMO) program Tachyon, offered by ASML, the barrier function uses a hard constraint with $x^{-3}$, i.e., b=3. In general, the barrier function is expressed as:

$$B(I_s) = -\mu\left[\beta - \left|\frac{K(\alpha)}{DE(\alpha)}\right|\right]^{-b} \quad \text{(Eq. 11)}$$

Here, μ is a fixed parameter which is related to the weight of the barrier function in Eq. 11 compared to the unconstrained minimization in Eq. 9. If m is large, the barrier function has less weight (because of the minus sign) than the unconstrained minimization. In a non-limiting example, values of α, μ and b may be equal to 0.5, 1 and 1 respectively.

The following equation represents an auxiliary cost function to be minimized, which is the original cost function in Eq. 9 modified by the barrier function in Eq. 11:

$$\min CF(I_s) = \sum_{i=1}^{m}\left[\frac{\partial OV(\alpha)}{\partial q_i}\right]^n - \mu\left[\beta - \left|\frac{K(\alpha)}{DE(\alpha)}\right|\right]^{-b} \quad \text{(Eq. 12)}$$

For minimizing the auxiliary cost function, the gradient of the auxiliary cost function needs to be zero $$\frac{\partial}{\partial I_s}CF(I_s) = n\sum_{i=1}^{m}\left[\frac{\partial OV(\alpha)}{\partial q_i}\right]^{n-1}\frac{\partial^2 OV(\alpha)}{\partial I_s \partial q_i} + b\mu\left[\beta - \left|\frac{K(\alpha)}{DE(\alpha)}\right|\right]^{-b-1}\frac{\partial}{\partial I_s}\left|\frac{K(\alpha)}{DE(\alpha)}\right| \quad \text{(Eq. 13)}$$

Since out of the three process variations studied (etch depth, aSWA and floor tilt), there was no overlay sensitivity observed for etch depth (as seen in the results Table in FIG. 7), the root mean square (rms) asymmetry due to process variation is simplified in terms of the two asymmetry parameters aSWA and floor tilt:

$$\sqrt{CF} = \sqrt{\left|\frac{\partial OV}{\partial SWA}\right|^2 + \left|\frac{\partial OV}{\partial FloorTilt}\right|^2} \quad \text{(Eq. 14)}$$

Figure 8:
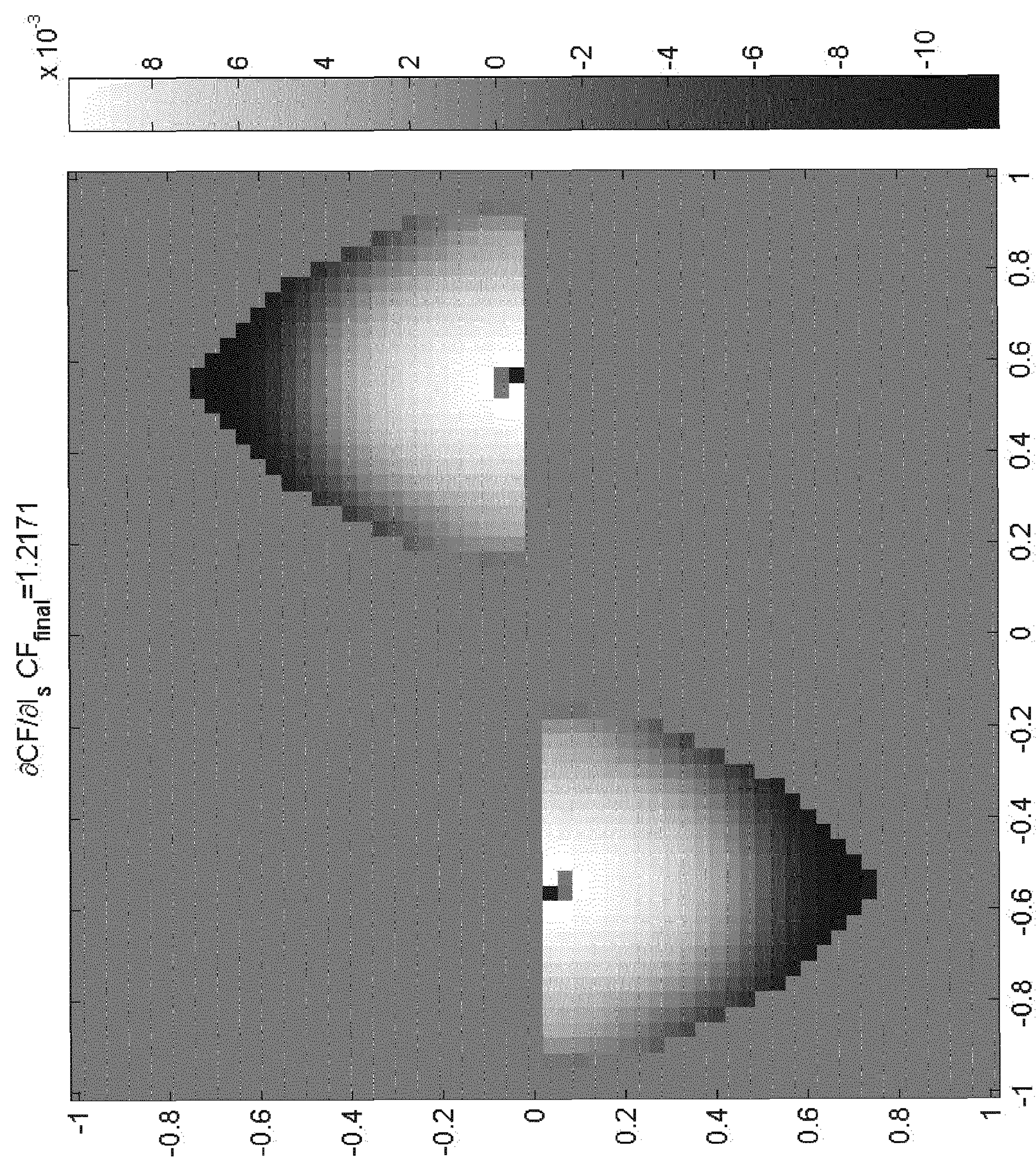
FIGS. 8-10 show change in illumination shape according to the optimization algorithm disclosed herein.
Figure 9:
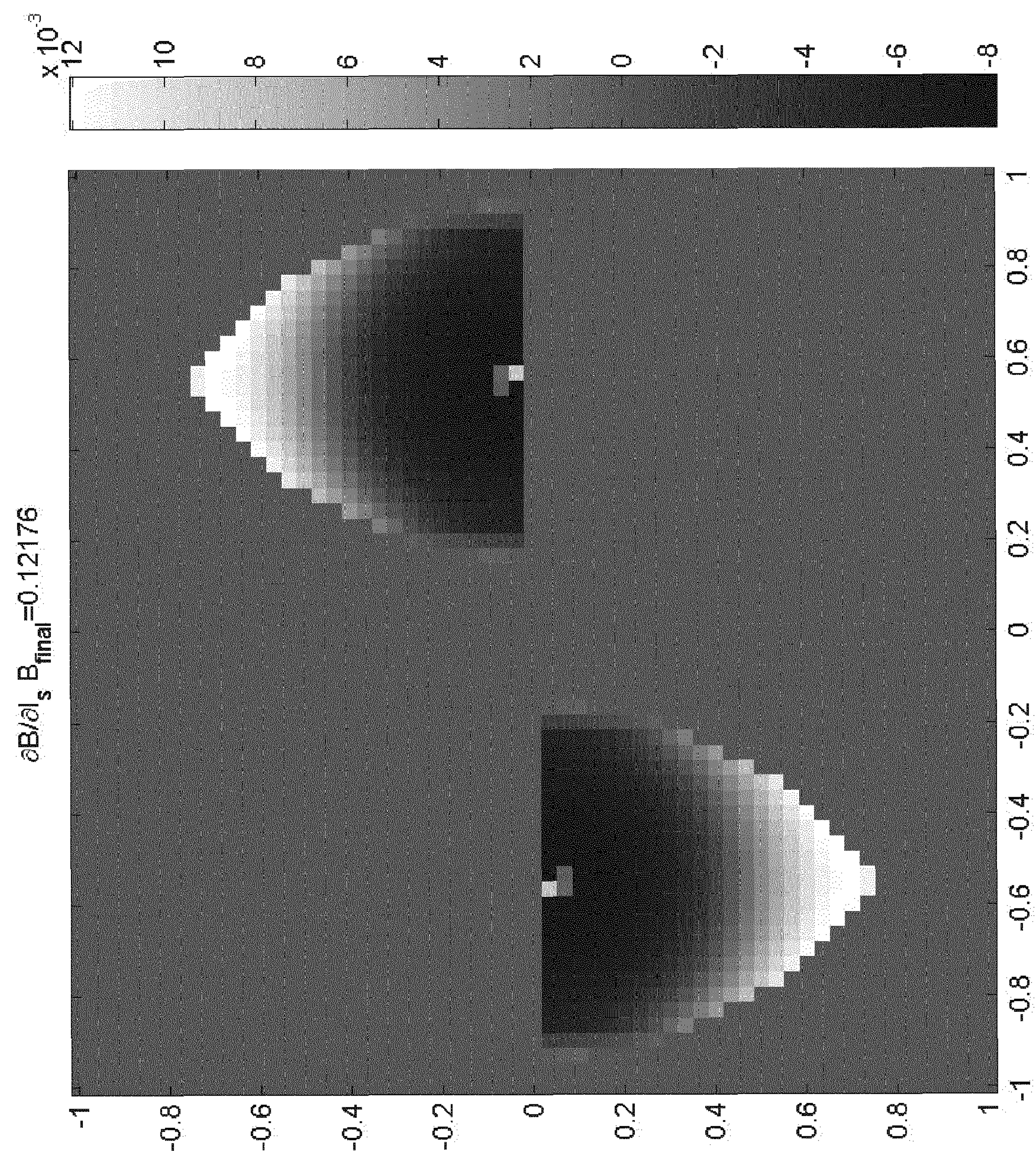
Figure 10:
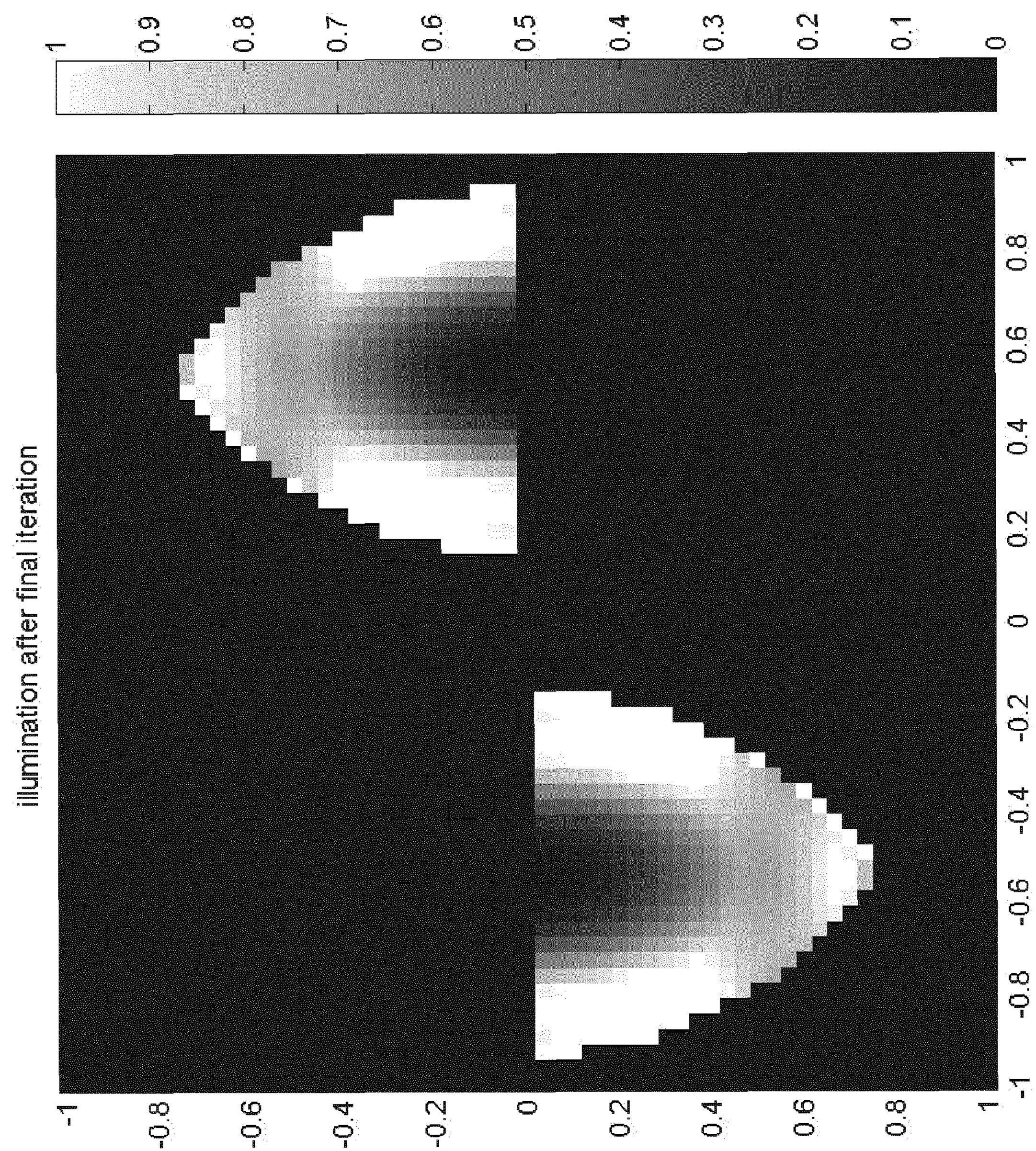

CF is either the unconstrained cost function in Eq. 9 or the auxiliary cost function of Eq. 11, constrained by the bather function. Simulations have shown that the value of asymmetry CF is reduced from 1.56 for an initial configuration of the illumination to 1.22 for an illumination optimized for structural asymmetry, i.e. a 12% improvement is achieved by the embodiments of the present disclosure. The percentage improvement varies depending on the target structure, but at least a 5-50% improvement is seen routinely in the experimental results. FIG. 8 shows a plot of final illumination configuration for the device DRAM SN layer structure shown in FIG. 5, when an unconstrained cost function CF is minimized using the algorithm of the present disclosure. FIG. 9 shows the spatial distribution of the barrier function, B, where stack sensitivity SS>0.1. FIG. 10 shows the final illumination configuration after the final iteration of the optimization algorithm.

Figure 11:
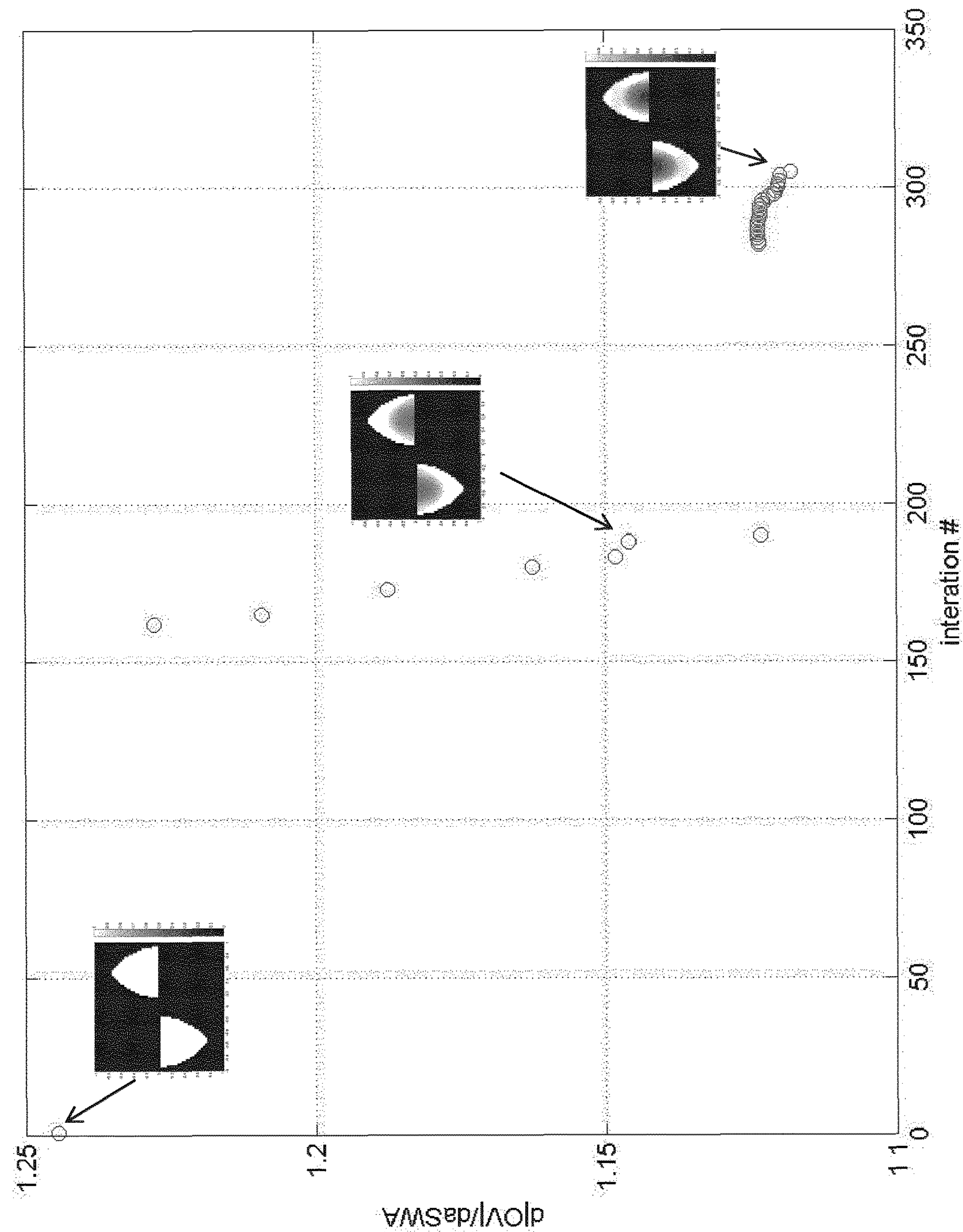
FIGS. 11-14 show various mathematical functions plotted against the number of iterations used in the optimization algorithm disclosed herein.

FIG. 11 shows a plot of overlay sensitivity with respect to the asymmetry parameter aSWA, showing that as the number of iterations increases, and correspondingly the illumination shape changes, the sensitivity to aSWA decreases.

Figure 12:
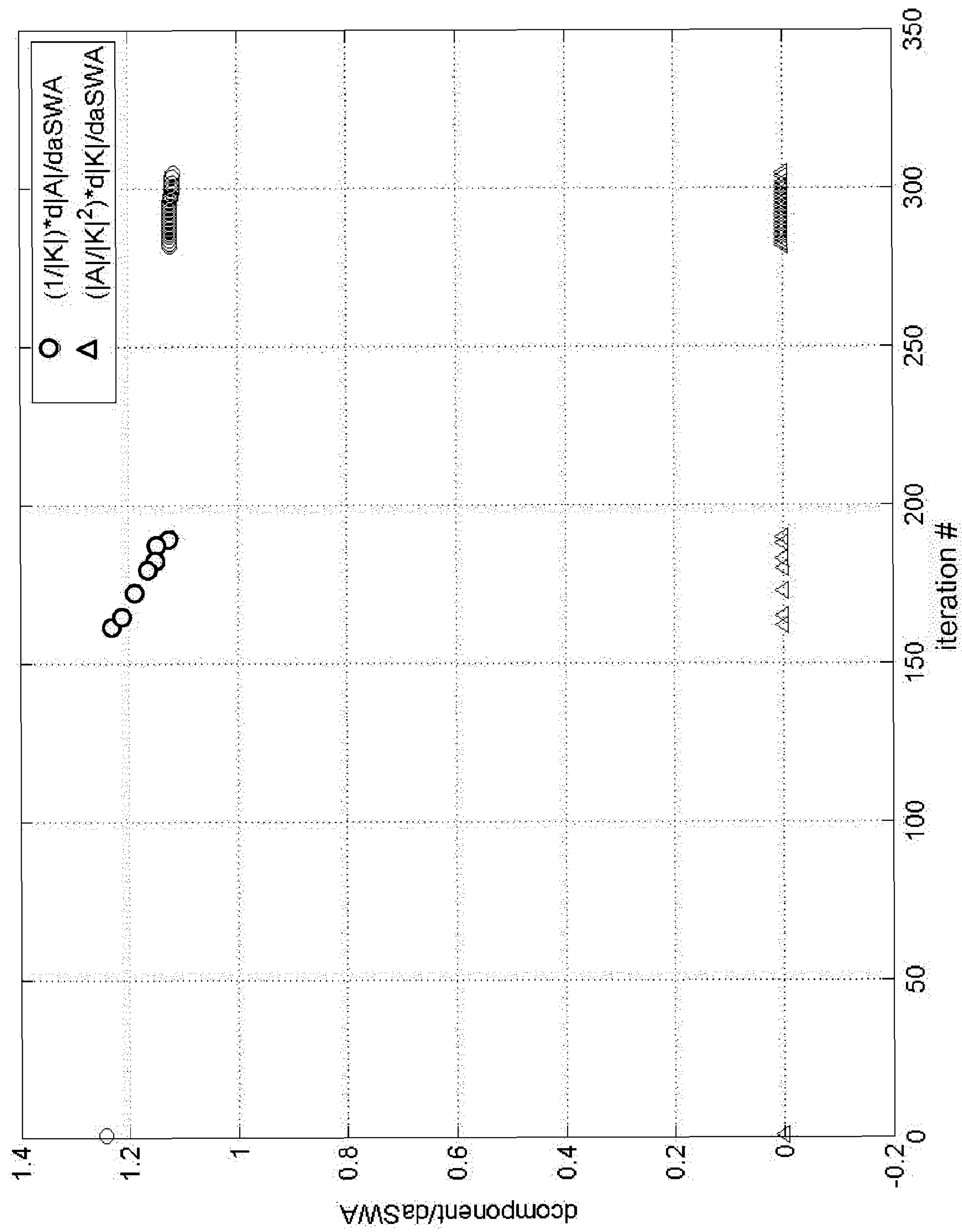

In FIG. 12, the first order derivative function (1/K)*∂A/∂aSWA is plotted vs. the number of iterations, and the results are shown by the circles. FIG. 12 also shows the second order derivative $(A/K^2)$*∂|A|/∂aSWA, plotted as the triangles. Since the value of the second order derivative $(A/K^2)$*∂|A|/∂aSWA is nearly zero, i.e. the gradient of the first order derivative doesn't change with the number of iterations, mathematically, overlay sensitivity ∂OV/∂aSWA can be approximated by only the first order derivative, (1/K)*∂|A|/∂aSWA.

Figure 13:
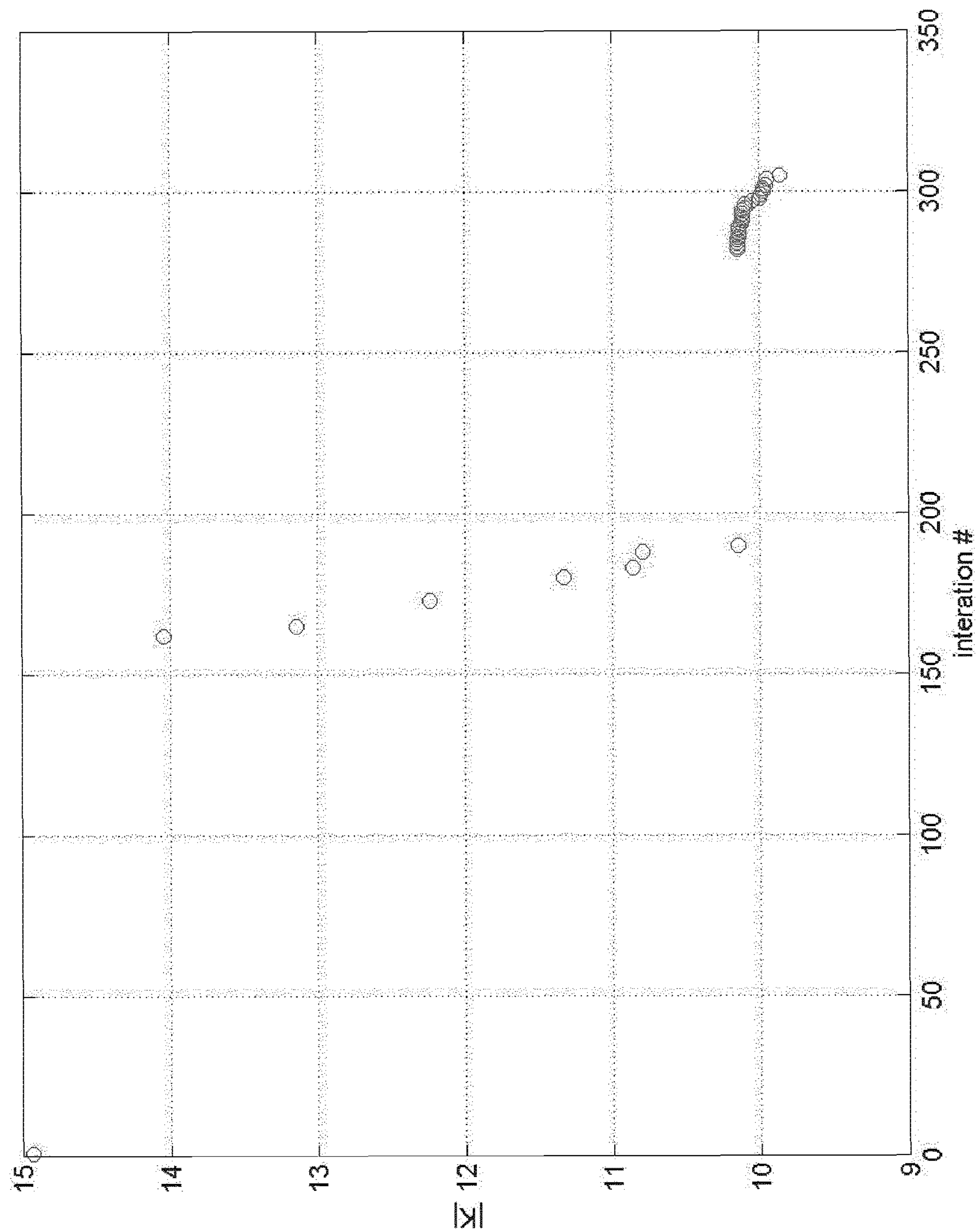
Figure 14:
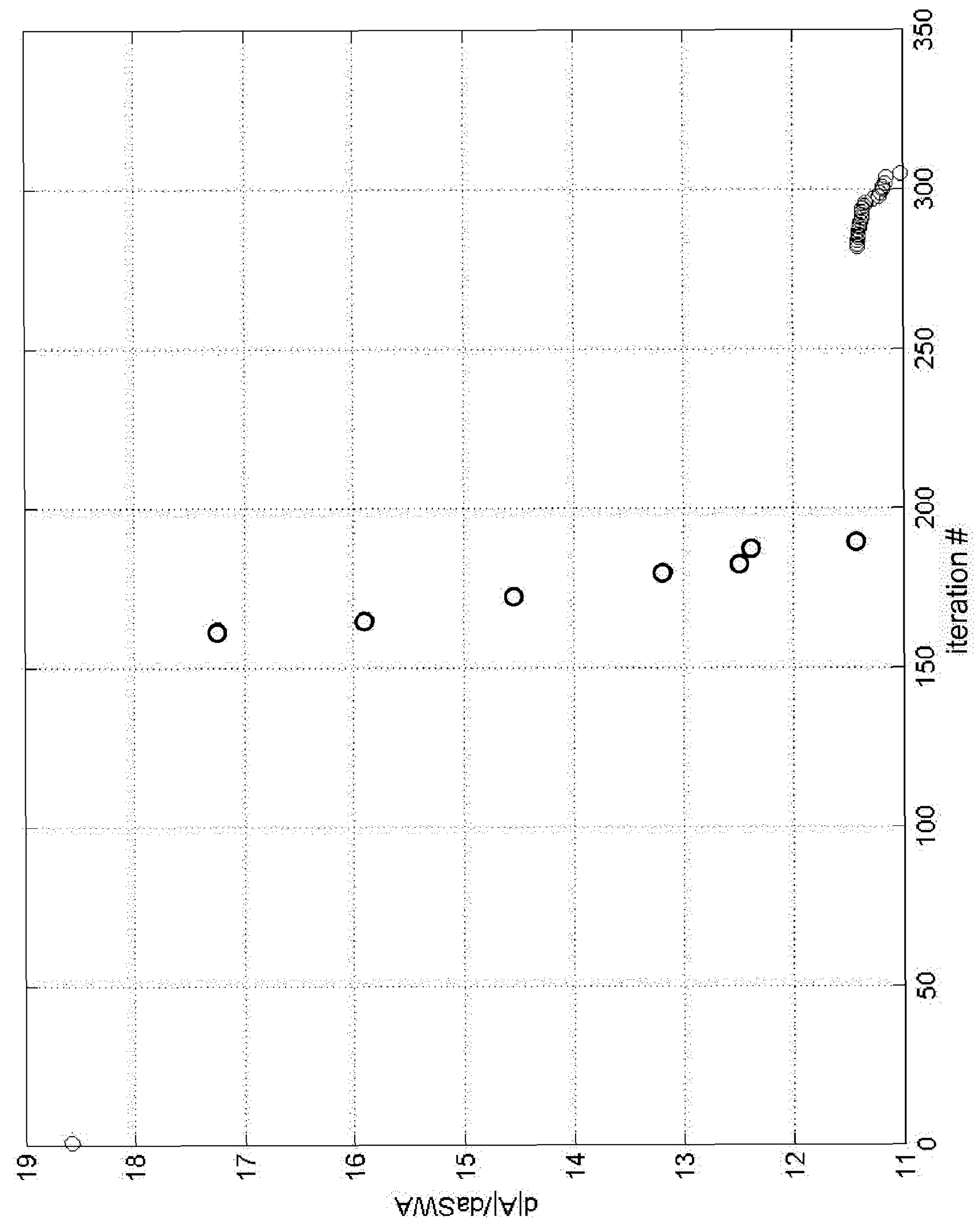

FIG. 13 plots the value of K vs. the number of iterations, and FIG. 14 plots ∂|A|/∂aSWA vs. the number of iterations. Illumination pixels are adjusted so that asymmetry A decreases. K decreases with number of iterations, and ∂|A|/∂aSWA decreases faster than the increase of 1/K. Consequently, overlay sensitivity ∂OV|/∂aSWA decreases. The results prove that by adjusting illumination shape pixel by pixel, sensitivity of overlay measurement to process-induced structural asymmetry can be reduced.

Some of the features and advantages of the present optimization techniques are, among other things: removal of zeroth order light can be quickly done through simple geometry constraints; and, most of the device structures are not restricted by minimum stack sensitivity barrier function, B. In one embodiment, illumination optimization is based on maximization of K rather than reducing A in one embodiment. The asymmetry response, A, is independent of angle in the alignment camera. In an alternative embodiment, illumination optimization may be based on a reduction in sensitivity in A rather than an increase in K. Furthermore, in an embodiment, the response in the pupil plane may be examined in addition to the image plane, because the pupil plane has more information on asymmetry.

Figure 15:
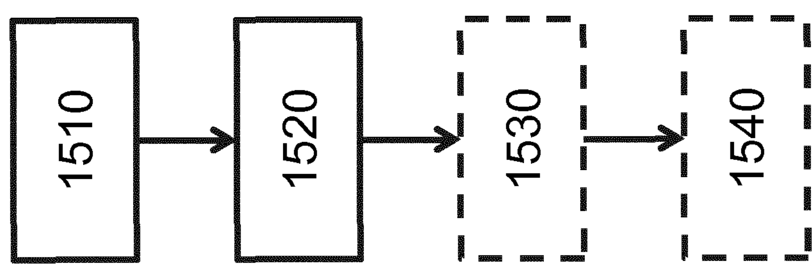
FIG. 15 schematically shows a flow for a method according to an embodiment.

FIG. 15 schematically shows a flow for a method according to an embodiment. In 1510, the intensity distribution in a pupil plane of the metrology apparatus is spatially divided into a plurality of pixels. In 1520, an effect of a structural asymmetry in a target on a measurement by the metrology apparatus on the target is reduced, by adjusting, using a computer, intensities of the plurality of pixels. The pupil plane may be an illumination pupil or a detection pupil. The measurement may measure overlay, focus, aberration or a combination thereof. The structural asymmetry may include one or more of: a difference in side wall angle (SWA), floor tilt, and etch depth. Adjusting the intensities may include computing a cost function that represents the effect and that is a function of the intensities. The cost function may represent contrast of an image of the target. Adjusting the intensities may include finding values of the intensities that locally or globally minimizes or maximizes the cost function. The cost function may be constrained. In optional 1530, one or more pixels from the plurality of pixels are identified, where the one or more pixels do not contribute to a signal used by the metrology apparatus in the measurement, or where the contribution of the one or more pixels to the signal is below a threshold. In optional 1540, the intensities at the one or more identified pixels are adjusted. The measurement may be an overlay measurement and the one or more pixels do not contribute to a diffraction order used in the overlay measurement. The diffraction order may be a $+1^{st}$ diffraction order or $-1^{st}$ diffraction order. Reducing the effect of the structural asymmetry may include adjusting polarizations at the pixels. Reducing the effect of the structural asymmetry may include adjusting bandwidths at the pixels. Reducing the effect of the structural asymmetry may include adjusting wavelengths at the pixels.

Figure 16:
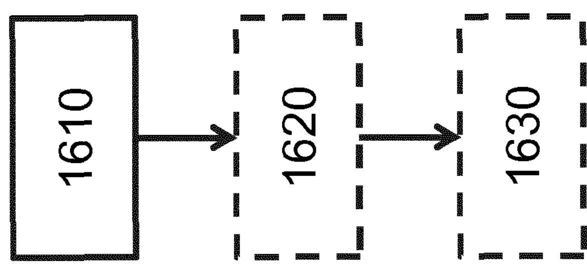
FIG. 16 schematically shows a flow for a method according to an embodiment.

FIG. 16 schematically shows a flow for a method according to an embodiment. In 1610, a parameter of the metrology apparatus or of a measurement by the metrology apparatus on a target is adjusted, based on a characteristic of the target. The measurement may be selected from a group consisting of a measurement of overlay, a measurement of focus, a measurement of aberration, and a combination thereof. The parameter may be selected from a group consisting of an intensity at an illumination pupil of the metrology apparatus, a polarization at an illumination pupil of the metrology apparatus, a wavelength at an illumination pupil of the metrology apparatus, a bandwidth at an illumination pupil of the metrology apparatus, an intensity at a detection pupil of the metrology apparatus, a polarization at a detection pupil of the metrology apparatus, a wavelength at a detection pupil of the metrology apparatus, a bandwidth at a detection pupil of the metrology apparatus, and a combination thereof. For example, the intensity at the detection pupil or the source pupil may be adjusted using an aperture on the optical path. The parameter may be a characteristic of projection optics of the metrology apparatus or a characteristic of a source of the metrology apparatus. Adjusting the parameter may impact a quality of the measurement. The quality may be detectability of the target, accuracy of the measurement, or robustness of the measurement. Adjusting the parameter may include computing a cost function that represents the quality and is a function of the parameter. The cost function may represent contrast of an image of the target. Adjusting the parameter may include finding a value of the parameter that locally or globally minimizes or maximizes the cost function. The cost function is constrained. Adjusting the parameter may include iteratively computing the cost function and adjusting the parameter until a termination criterion is met. The cost function may be a function of the characteristic of the target. In optional 1620, the characteristic of the target is adjusted. In optional 1630, the adjusted parameter associated with the characteristic of the target is stored. The characteristic of the target may include a location of the target on a substrate.

The invention may further be described using the following clauses:

1. A method of adjusting a metrology apparatus, the method comprising:

spatially dividing an intensity distribution in a pupil plane of the metrology apparatus into a plurality of pixels;

reducing an effect of a structural asymmetry in a target on a measurement by the metrology apparatus on the target, by adjusting, using a computer, intensities of the plurality of pixels.

2. The method of clause 1, wherein the pupil plane is an illumination pupil or a detection pupil.

3. The method of any one of clauses 1 to 2, wherein the measurement measures overlay, focus, aberration or a combination thereof.

4. The method of any one of clauses 1 to 3, wherein the structural asymmetry comprises one or more of: a difference in side wall angle (SWA), floor tilt, and etch depth.

5. The method of any one of clauses 1 to 4, wherein adjusting the intensities comprises computing a cost function that represents the effect and that is a function of the intensities.

6. The method of clause 5, wherein the cost function represents contrast of an image of the target.

7. The method of clause 5, wherein adjusting the intensities further comprises finding values of the intensities that locally or globally minimizes or maximizes the cost function.

8. The method of clause 5, wherein the cost function is constrained.

9. The method of any one of clauses 1 to 8, further comprising:

identifying one or more pixels from the plurality of pixels, wherein the one or more pixels do not contribute to a signal used by the metrology apparatus in the measurement or wherein the contribution of the one or more pixels to the signal is below a threshold, and adjusting the intensities at the one or more identified pixels.

10. The method of clause 9, wherein the measurement is an overlay measurement and the one or more pixels do not contribute to a diffraction order used in the overlay measurement.

11. The method of clause 10, wherein the diffraction order is a $+1^{st}$ diffraction order or $-1^{st}$ diffraction order.

12. The method of any one of clauses 1 to 11, wherein reducing the effect of the structural asymmetry further comprises adjusting polarizations at the pixels.

13. The method of any one of clauses 1 to 12, wherein reducing the effect of the structural asymmetry further comprises adjusting bandwidths at the pixels.

14. The method of any one of clauses 1 to 13, wherein reducing the effect of the structural asymmetry further comprises adjusting wavelengths at the pixels.

15. A computer program product comprising a non-transitory computer-readable medium having instructions thereon, the instructions when executed by a computer implementing a method comprising:

spatially dividing an intensity distribution in a pupil plane of the metrology apparatus into a plurality of pixels;

reducing an effect of a structural asymmetry in a target on a measurement by the metrology apparatus on the target, by adjusting, using a computer, intensities of the plurality of pixels.

16. The computer program product of clause 15, wherein the pupil plane is an illumination pupil or a detection pupil.

17. The computer program product of any one of clauses 15 to 16, wherein the measurement measures overlay, focus, aberration or a combination thereof.

18. The computer program product of any one of clauses 15 to 17, wherein the structural asymmetry comprises one or more of: a difference in side wall angle (SWA), floor tilt, and etch depth.

19. The computer program product of any one of clauses 15 to 18 wherein adjusting the intensities comprises computing a cost function that represents the effect and is a function of the intensities.

20. The computer program product of clause 19, wherein the cost function represents contrast of an image of the target.

21. The computer program product of clause 19, wherein adjusting the intensities further comprises finding values of the intensities that locally or globally minimizes or maximizes the cost function.

22. The computer program product of clause 19, wherein the cost function is constrained.

23. The computer program product of any one of clauses 15 to 22, further comprising:

identifying one or more pixels from the plurality of pixels, wherein the one or more pixels do not contribute to a signal used by the metrology apparatus in the measurement or wherein the contribution of the one or more pixels to the signal is below a threshold, and adjusting the intensities at the one or more identified pixels.

24. The computer program product of clause 23, wherein the measurement is an overlay measurement and the one or more pixels do not contribute to a diffraction order used in the overlay measurement.

25. The computer program product of clause 24, wherein the diffraction order is a $+1^{st}$ diffraction order or $-1^{st}$ diffraction order.

26. The computer program product of any one of clauses 15 to 25, wherein reducing the effect of the structural asymmetry further comprises adjusting polarizations at the pixels.

27. The computer program product of any one of clauses 15 to 26, wherein reducing the effect of the structural asymmetry further comprises adjusting bandwidths at the pixels.

28. The computer program product of any one of clauses 15 to 27, wherein reducing the effect of the structural asymmetry further comprises adjusting wavelengths at the pixels.

29. A method of adjusting a metrology apparatus, the method comprising:

adjusting a parameter of the metrology apparatus or of a measurement by the metrology apparatus on a target, based on a characteristic of the target.

30. The method of clause 29, wherein the measurement is selected from a group consisting of a measurement of overlay, a measurement of focus, a measurement of aberration, and a combination thereof.

31. The method of any one of clauses 29 to 30, wherein the parameter is selected from a group consisting of an intensity at an illumination pupil of the metrology apparatus, a polarization at an illumination pupil of the metrology apparatus, a wavelength at an illumination pupil of the metrology apparatus, a bandwidth at an illumination pupil of the metrology apparatus, an intensity at a detection pupil of the metrology apparatus, a polarization at a detection pupil of the metrology apparatus, a wavelength at a detection pupil of the metrology apparatus, a bandwidth at a detection pupil of the metrology apparatus, and a combination thereof.

32. The method of any one of clauses 29 to 31, wherein the parameter is a characteristic of projection optics of the metrology apparatus or a characteristic of a source of the metrology apparatus.

33. The method of any one of clauses 29 to 32, wherein adjusting the parameter impacts a quality of the measurement.

34. The method clause 33, wherein the quality is detectability of the target, accuracy of the measurement, or robustness of the measurement.

35. The method of clause 33, wherein adjusting the parameter comprises computing a cost function that represents the quality and is a function of the parameter.

36. The method of clause 35, wherein the cost function represents contrast of an image of the target.

37. The method of clause 35, wherein adjusting the parameter further comprises finding a value of the parameter that locally or globally minimizes or maximizes the cost function.

38. The method of clause 35, wherein the cost function is constrained.

39. The method of clause 35, wherein adjusting the parameter comprises iteratively computing the cost function and adjusting the parameter until a termination criterion is met.

40. The method of clause 35, wherein the cost function is a function of the characteristic of the target.

41. The method of any one of clauses 29 to 40, further comprising adjusting the characteristic of the target.

42. The method of any one of clauses 29 to 41, further comprising storing the adjusted parameter associated with the characteristic of the target.

43. The method of any one of clauses 29 to 42, wherein the characteristic of the target comprises a location of the target on a substrate.

44. A method comprising:

setting a parameter of a metrology apparatus or of a measurement by the metrology apparatus on a target to a value adjusted based on a characteristic of the target;

measuring the target with the metrology apparatus.

45. A method comprising:

setting a characteristic of a target to a value based on which a parameter of a metrology apparatus or of a measurement by the metrology apparatus on the target is adjusted;

fabricating the target on a substrate.

46. A computer program product comprising a non-transitory computer-readable medium having instructions thereon, the instructions when executed by a computer implementing a method comprising:

adjusting a parameter of the metrology apparatus or of a measurement by the metrology apparatus on a target, based on a characteristic of the target.

47. The computer program product of clause 46, wherein the measurement is selected from a group consisting of a measurement of overlay, a measurement of focus, a measurement of aberration, and a combination thereof.

48. The computer program product of any one of clauses 46 to 47, wherein the parameter is selected from a group consisting of an intensity at an illumination pupil of the metrology apparatus, a polarization at an illumination pupil of the metrology apparatus, a wavelength at an illumination pupil of the metrology apparatus, a bandwidth at an illumination pupil of the metrology apparatus, an intensity at a detection pupil of the metrology apparatus, a polarization at a detection pupil of the metrology apparatus, a wavelength at a detection pupil of the metrology apparatus, a bandwidth at a detection pupil of the metrology apparatus, and a combination thereof.

49. The computer program product of any one of clauses 46 to 48, wherein the parameter is a characteristic of projection optics of the metrology apparatus or a characteristic of a source of the metrology apparatus.

50. The computer program product of any one of clauses 46 to 49, wherein adjusting the parameter impacts a quality of the measurement.

51. The computer program product clause 50, wherein the quality is detectability of the target, accuracy of the measurement, or robustness of the measurement.

52. The computer program product of clause 50, wherein adjusting the parameter comprises computing a cost function that represents the quality and is a function of the parameter.

53. The computer program product of clause 50, wherein the cost function represents contrast of an image of the target.

54. The computer program product of clause 50, wherein adjusting the parameter further comprises finding a value of the parameter that locally or globally minimizes or maximizes the cost function.

55. The computer program product of clause 50, wherein the cost function is constrained.

56. The computer program product of clause 50, wherein adjusting the parameter comprises iteratively computing the cost function and adjusting the parameter until a termination criterion is met.

57. The computer program product of clause 50, wherein the cost function is a function of the characteristic of the target.

58. The computer program product of any one of clauses 46 to 57, wherein the method further comprises adjusting the characteristic of the target.

59. The computer program product of any one of clauses 46 to 58, wherein the method further comprises storing the adjusted parameter associated with the characteristic of the target.

60. The computer program product of any one of clauses 46 to 59, wherein the characteristic of the target comprises a location of the target on a substrate.

62. A computer program product comprising a non-transitory computer-readable medium having instructions thereon, the instructions when executed by a computer implementing a method comprising:

setting a parameter of a metrology apparatus or of a measurement by the metrology apparatus on a target to a value adjusted based on a characteristic of the target;

measuring the target with the metrology apparatus.

63. A computer program product comprising a non-transitory computer-readable medium having instructions thereon, the instructions when executed by a computer implementing a method comprising:

setting a characteristic of a target to a value based on which a parameter of a metrology apparatus or of a measurement by the metrology apparatus on the target is adjusted;

fabricating the target on a substrate.

Persons skilled in the art would appreciate that additional steps can be added in the process flow, and/or some steps shown in the flowchart can be substituted by steps specific to a certain lithography process without departing from the scope of the disclosure. The descriptions above are intended to be illustrative, not limiting. Thus, it will be apparent to one skilled in the art that modifications may be made to the embodiments as described without departing from the scope of the claims set out below.

The invention claimed is:

1. A method for adjusting a metrology apparatus, the method comprising:

obtaining an intensity distribution of radiation for a pupil plane of the metrology apparatus spatially divided into a plurality of pixels; and reducing an effect of a structural asymmetry in a target on a measurement by the metrology apparatus on the target, by adjusting, by a hardware computer system, a characteristic of illumination radiation for the target so as to adjust an optical characteristic of the radiation of one or more pixels of the plurality of pixels.

2. The method of claim 1, wherein the pupil plane is an illumination pupil or a detection pupil.

3. The method of claim 1, wherein the measurement measures overlay, focus, aberration or a combination selected therefrom.

4. The method of claim 1, wherein the structural asymmetry comprises one or more selected from: a difference in side wall angle (SWA), floor tilt, and/or etch depth.

5. The method of claim 1, wherein adjusting the optical characteristic of the radiation comprises computing a cost function that represents the effect and that is a function of intensities of the plurality of pixels.

6. The method of claim 5, wherein adjusting the optical characteristic of the radiation further comprises finding values of intensities that locally or globally minimizes or maximizes the cost function, or wherein the cost function is constrained.

7. The method of claim 1, further comprising:

identifying one or more pixels from the plurality of pixels, wherein the one or more identified pixels do not contribute to a signal used by the metrology apparatus in the measurement or wherein the contribution of the one or more identified pixels to the signal is below a threshold, and adjusting the optical characteristic of the radiation at the one or more identified pixels.

8. The method of claim 7, wherein the measurement is an overlay measurement and the one or more identified pixels do not contribute to a diffraction order used in the overlay measurement.

9. The method of claim 1, wherein adjusting the optical characteristic of one of more pixels of the plurality of pixels comprises adjusting polarization at the one or more pixels of the plurality of pixels, and/or comprises adjusting bandwidth at the one or more pixels of the plurality of pixels, and/or comprises adjusting wavelength at the one or more pixels of the plurality of pixels.

10. The method of claim 1, wherein adjusting the optical characteristic of one of more pixels of the plurality of pixels comprises adjusting intensity at the one or more pixels of the plurality of pixels.

11. A computer program product comprising a non-transitory computer-readable medium having instructions thereon, the instructions, when executed by a computer system, configured to cause the computer system to at least:

obtain an intensity distribution of radiation of a pupil plane of a metrology apparatus spatially divided into a plurality of pixels; and reduce an effect of a structural asymmetry in a target on a measurement by the metrology apparatus on the target, by adjustment of a characteristic of illumination radiation for the target so as to adjust an optical characteristic of the radiation of one or more pixels of the plurality of pixels.

12. The computer program product of claim 11, wherein the pupil plane is an illumination pupil or a detection pupil.

13. The computer program product of claim 11, wherein the measurement measures overlay, focus, aberration or a combination selected therefrom.

14. The computer program product of claim 11, wherein the structural asymmetry comprises one or more selected from: a difference in side wall angle (SWA), floor tilt, and/or etch depth.

15. The computer program product of claim 11, wherein the instructions configured to adjust the optical characteristic of the radiation are further configured to compute a cost function that represents the effect and that is a function of intensities of the plurality of pixels.

16. The computer program product of claim 11, wherein the instructions are further configured to cause the computer system to:

identify one or more pixels from the plurality of pixels, wherein the one or more identified pixels do not contribute to a signal used by the metrology apparatus in the measurement or wherein the contribution of the one or more identified pixels to the signal is below a threshold, and adjust the optical characteristic of the radiation at the one or more identified pixels.

17. The computer program product of claim 11, wherein the instructions configured to adjust the optical characteristic of the radiation are configured to adjust intensity at the one or more pixels of the plurality of pixels, and/or adjust polarization at the one or more pixels of the plurality of pixels, and/or adjust bandwidth at the one or more pixels of the plurality of pixels, and/or adjust wavelength at the one or more pixels of the plurality of pixels.

18. A method comprising:

setting a characteristic of a target to a value based on which a parameter of a metrology apparatus or of a measurement by the metrology apparatus on the target is adjusted; and fabricating the target with the set characteristic on a substrate.

19. The method of claim 18, wherein setting the characteristic comprises computing a cost function that is a function of the characteristic of the target.

20. A computer program product comprising a non-transitory computer-readable medium having instructions thereon, the instructions, when executed by a computer system, configured to cause the computer system to at least:

obtain a simulated intensity distribution of radiation of a pupil plane of a metrology apparatus, the simulated intensity distribution divided into a plurality of pixels; and adjust an intensity of radiation at one or more pixels of the plurality of pixels to reduce an effect of a structural asymmetry in a measurement target on a measurement by a metrology apparatus of the measurement target by adjusting a characteristic of illumination radiation for the target.

* * * * *